(12) United States Patent
Irie et al.

(10) Patent No.: US 6,965,338 B2
(45) Date of Patent: Nov. 15, 2005

(54) CASCADE A/D CONVERTER

(75) Inventors: Koichi Irie, Musashino (JP); Tomohiro Kawachi, Musashino (JP); Tatsuro Akiyama, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 10/991,497

(22) Filed: Nov. 19, 2004

(65) Prior Publication Data

US 2005/0162300 A1  Jul. 28, 2005

(30) Foreign Application Priority Data

Jan. 26, 2004 (JP) .............................. 2004-016770
Jul. 15, 2004 (JP) .............................. 2004-208528

(51) Int. Cl.$^7$ .............................................. H03M 1/38
(52) U.S. Cl. ...................................... 341/161; 341/155
(58) Field of Search .................. 341/155, 141, 341/51, 110, 157, 166, 151; 704/213, 211; 370/268; 360/32, 48; 365/45

(56) References Cited

U.S. PATENT DOCUMENTS 6,020,840 A * 2/2000 Ong ............................ 341/155
6,166,674 A * 12/2000 Wingender et al. ......... 341/158
6,222,477 B1 * 4/2001 Irie et al. ..................... 341/161
6,501,412 B2 * 12/2002 Tanabe ........................ 341/161

FOREIGN PATENT DOCUMENTS

JP  9-238077  9/1997

* cited by examiner

Primary Examiner—Brian Young
(74) Attorney, Agent, or Firm—Westerman, Hattori, Daniels & Adrian, LLP

(57) ABSTRACT

A cascade A/D converter that has shorter settling time and enables high-speed operation is provided. A cascade A/D converter comprises fundamental constituent elements cascaded in plural stages, each fundamental constituent element comprising a first comparator for inputting an analog input signal, a D/A converter for converting an output of the first comparator to an analog signal again, and a subtractor for subtracting an output of the D/A converter from the analog input signal, the fundamental constituent elements comprising: a second comparator for inputting the analog input signal every least significant bit near a transition point of the first comparator; and an arithmetic operating unit for generating upper bits based on an output of the first comparator and interpolating lower bits based on an output of the second comparator.

13 Claims, 18 Drawing Sheets

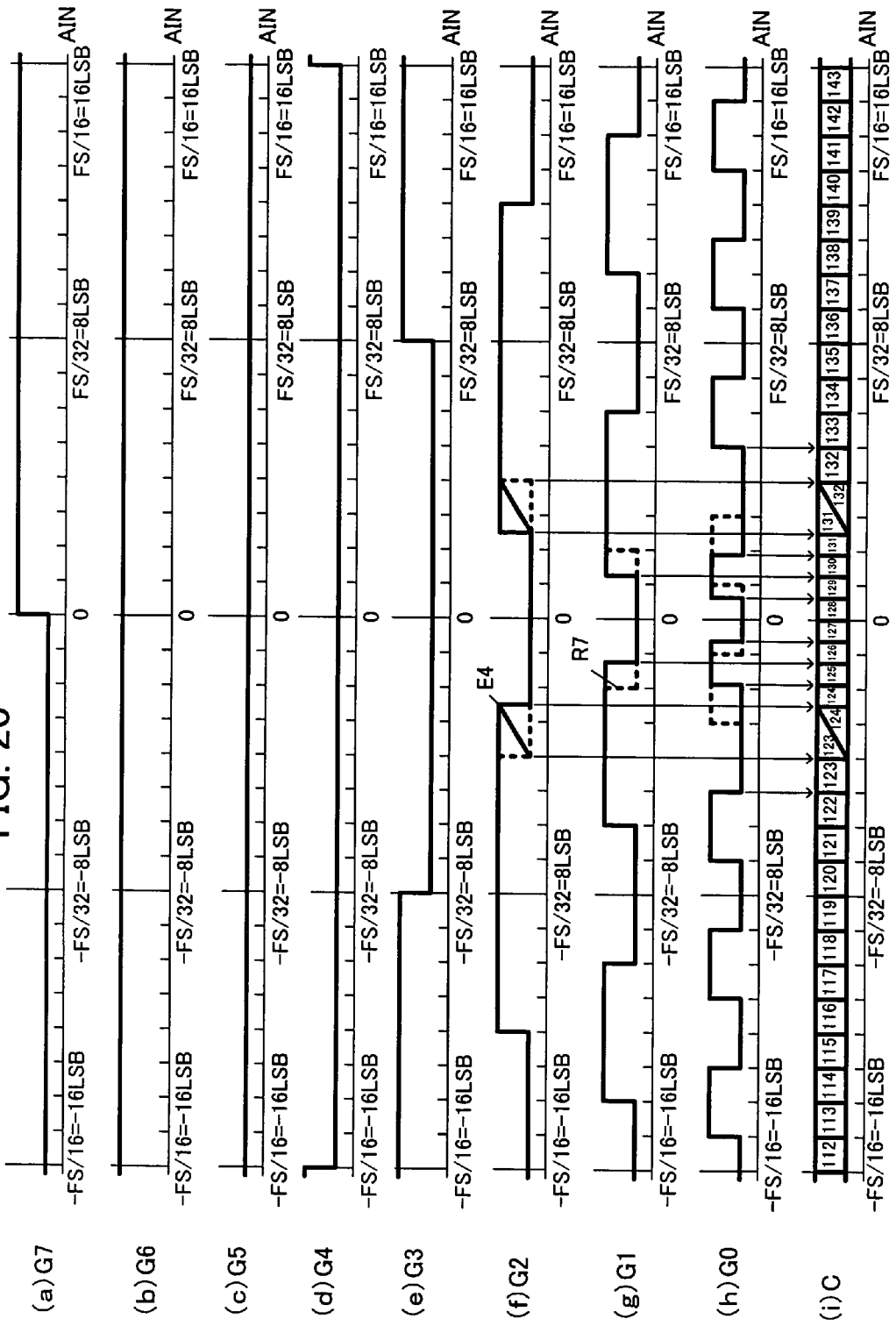

CASCADE A/D CONVERTER

BACKGROUND OF THE INVENTION

1. Field of the Invention

This invention relates to a cascade A/D converter used for a digital measuring device such as a digital oscilloscope.

2. Description of the Related Art

In a conventional cascade A/D converter, fundamental constituent elements ADA are cascaded in plural stages, the fundamental constituent elements ADA having comparators (10a to 10f), which are first comparators for converting an analog input signal AIN to digital signals (D7 to D0), D/A converters (20a to 20f) for converting outputs (B7 to B2) of the comparators (10a to 10f) to analog signals again, and subtractors (30a to 30f) for subtracting outputs of the D/A converters (20a to 20f) from the analog input signal AIN (see, for example, Patent Document 1).

FIG. 1 is a structural view showing the conventional cascade A/D converter.

In FIG. 1, a non-inverting input of the comparator 10a is connected to the analog input signal AIN, and an inverting input of the comparator 10a is connected to a comparative voltage 0. The output B7 of the comparator 10a is connected to an error correcting circuit 110.

An input of the D/A converter 20a is connected to the output B7 of the comparator 10a.

Moreover, an addition input of the subtractor 30a is connected to the analog input signal AIN, and a subtraction input of the subtractor 30a is connected to the output of the D/A converter 20a.

At a comparator 9a, its non-inverting input is connected to the analog input signal AIN, and its inverting input is connected to a voltage −1LSB having polarity opposite to the polarity of a voltage corresponding to the least significant bit LSB.

Moreover, at a comparator 11a, its non-inverting input is connected to a voltage +1LSB corresponding to the least significant bit LSB, and its inverting input is connected to the analog input signal AIN.

At an AND circuit 60a, its input is connected to the output of the comparator 9a and the output of the comparator 11a, and its output W7 is connected to the error correcting circuit 110. The comparator 9a, the comparator 11a and the AND circuit 60a form a window comparator 70a.

The comparator 10a, the D/A converter 20a, the subtractor 30a and the window comparator 70a form the first fundamental constituent element ADA.

Similarly, a non-inverting input of the comparator 10b is connected to an output A1 of the subtractor 30a, and an inverting input of the comparator 10b is connected to a comparative voltage 0. The output B6 of the comparator 10b is connected to the error correcting circuit 110.

An input of the D/A converter 20b is connected to the output B6 of the comparator 10b.

Moreover, an addition input of the subtractor 30b is connected to the output A1 of the subtractor 30a, and a subtraction input of the subtractor 30b is connected to the output of the D/A converter 20b.

At a comparator 9b, its non-inverting input is connected to the output A1 of the subtractor 30a, and its inverting input is connected to the voltage −1LSB.

Moreover, at comparator 11b, its non-inverting input is connected to the voltage +1LSB, and its inverting input is connected to the output A1 of the subtractor 30a.

At an AND circuit 60b, its input is connected to the output of the comparator 9b, the output of the comparator 11b and an inverted version of the output W7, and its output W6 is connected to the error correcting circuit 110. The comparator 9b, the comparator 11b and the AND circuit 60b form a window comparator 70b.

The comparator 10b, the D/A converter 20b, the subtractor 30b and the window comparator 70b form the second fundamental constituent elements ADA.

The first fundamental constituent element ADA and the second fundamental constituent element ADA are cascaded with each other.

Similarly, the first fundamental constituent element ADA, the second fundamental constituent element ADA, the third fundamental constituent element ADA formed by the comparator 10c, the D/A converter 20c, the subtractor 30c and a window comparator 70c, the fourth fundamental constituent element ADA formed by the comparator 10d, the D/A converter 20d, the subtractor 30d and a window comparator 70d, the fifth fundamental constituent element ADA formed by the comparator 10e, the D/A converter 20e, the subtractor 30e and a window comparator 70e, and the sixth fundamental constituent element ADA formed by the comparator 10f, the D/A converter 20f, the subtractor 30f and a window comparator 70f, are cascaded.

That is, in the conventional example of FIG. 1, the fundamental constituent elements are cascaded in six stages.

A non-inverting input of the comparator 10g is connected to an output A6 of the subtractor 30f, and an inverting input of the comparator 10g is connected to the comparative voltage 0. An output B1 of the comparator 10g is connected to the error correcting circuit 110.

At a comparator 9g, its non-inverting input is connected to the output A6 of the subtractor 30f, and its inverting input is connected of the voltage −1LSB.

Moreover, at a comparator 11g, its non-inverting input is connected to the voltage +1LSB, and its inverting input is connected to the output A6 of the subtractor 30f.

At an AND circuit 60g, its input is connected to the output of the comparator 9g, the output of the comparator 11g, an inverted version of the output W7, an inverted version of the output W6, an inverted version of the output W5, an inverted version of the output W4, an inverted version of the output W3 and an inverted version of the output W2. Its output W1 is connected to the error correcting circuit 110.

The comparator 9g, the comparator 11g and the AND circuit 60g form a window comparator 70g.

The error correcting circuit 110 performs calculations based on the following logical expressions (1) to (8) and outputs digital signals D7 (most significant bit MSB) to D0 (least significant bit LSB). That is, in the conventional example of FIG. 1, digital signals (D7 to D0) of an 8-bit gray code are outputted.

$$D7 = B7 \quad (1)$$

$$D6 = (B7 \text{ xor } B6) \text{ or } W7 \quad (2)$$

$$D5 = \{(B6 \text{ xor } B5) \text{ or } W6\} \text{ and not } (W7) \quad (3)$$

$$D4 = \{(B5 \text{ xor } B4) \text{ or } W5\} \text{ and not } (W7) \text{ and not } (W6) \quad (4)$$

$$D3 = \{(B4 \text{ xor } B3) \text{ or } W4\} \text{ and not } (W7) \text{ and not } (W6) \text{ and not } (W5) \quad (5)$$

$$D2 = \{(B3 \text{ xor } B2) \text{ or } W3\} \text{ and not } (W7) \text{ and not } (W6) \text{ and not } (W5) \text{ and not } (W4) \quad (6)$$

$$D1 = \{(B2 \text{ xor } B1) \text{ or } W2\} \text{ and not } (W7) \text{ and not } (W6) \text{ and not } (W5) \text{ and not } (W4) \text{ and not } (W3) \quad (7)$$

$$D0 = W1 \quad (8)$$

The operation in the conventional example of FIG. 1 having the above-described structure will now be described.

The comparator 10a compares the analog input signal AIN with the comparative voltage 0 and converts (A/D conversion) the analog input signal AIN to a digital signal with respect to the digital signal D7 (most significant bit MSB).

The D/A converter 20a converts the 1-bit output of the comparator 10a to an analog signal again. The subtractor 30a subtracts the output of the D/A converter 20a from the analog input signal AIN.

Similarly, the comparator 10b compares the output A1 of the subtractor 30a with the comparative voltage 0 and converts (A/D conversion) the analog output A1 to a digital signal. Since the output A1 is the result of subtracting the output of D/A converter 20a from the analog input signal AIN, the comparator 10b performs A/D conversion of the second bit from the most significant bit MSB with respect to the digital signal D6.

Similarly, in the conventional example of FIG. 1, A/D conversion of each bit is performed sequentially.

In this manner, in the conventional example of FIG. 1, digital signals (D7 to D0) of 8-bit gray codes are outputted.

The window comparators (70a to 70g) generate mask signals to restrain occurrence of an error at a transition point from 0 to 1 and a transition point from 1 to 0 in the comparators (10a to 10g).

Patent Document 1: JP-A-9-238077

However, the conventional example of FIG. 1 has a problem that settling takes a long time because of the many stages of fundamental constituent elements ADA. Therefore, the conventional example of FIG. 1 has a difficulty in achievement of high-speed operation.

SUMMARY OF THE INVENTION

It is an object of this invention to provide a cascade A/D converter that requires a shorter settling time and enables high-speed operation.

BRIEF DESCRIPTION OF THE DRAWINGS

FIGS. 20A to 20I show operating waveforms in the case where an input range is 0.625 times in the embodiment of FIG. 11.

DETAILED DESCRIPTION OF THE PREFERRED EMBODIMENTS

Figure 1:
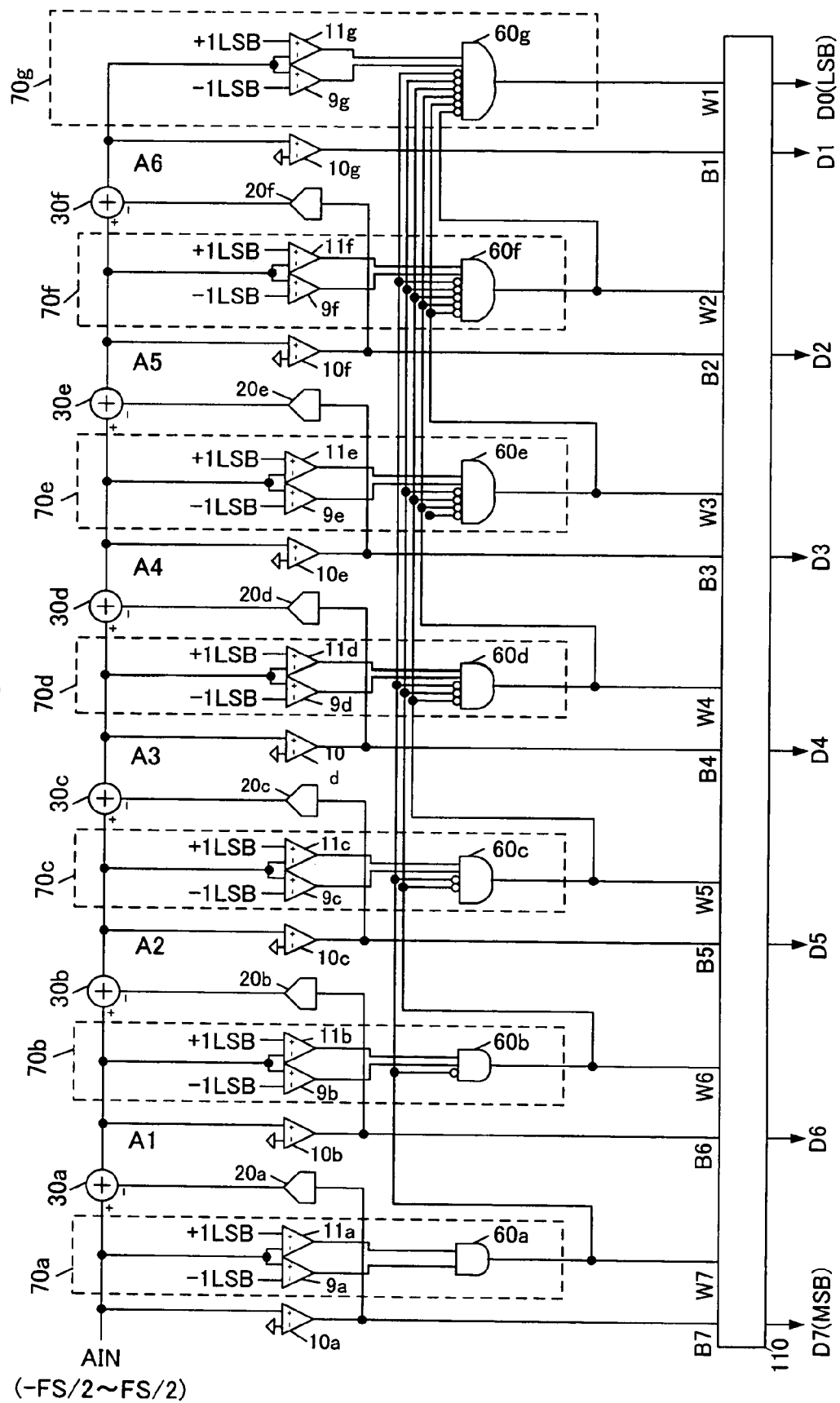
FIG. 1 is a structural view showing a conventional cascade A/D converter.
Figure 2:
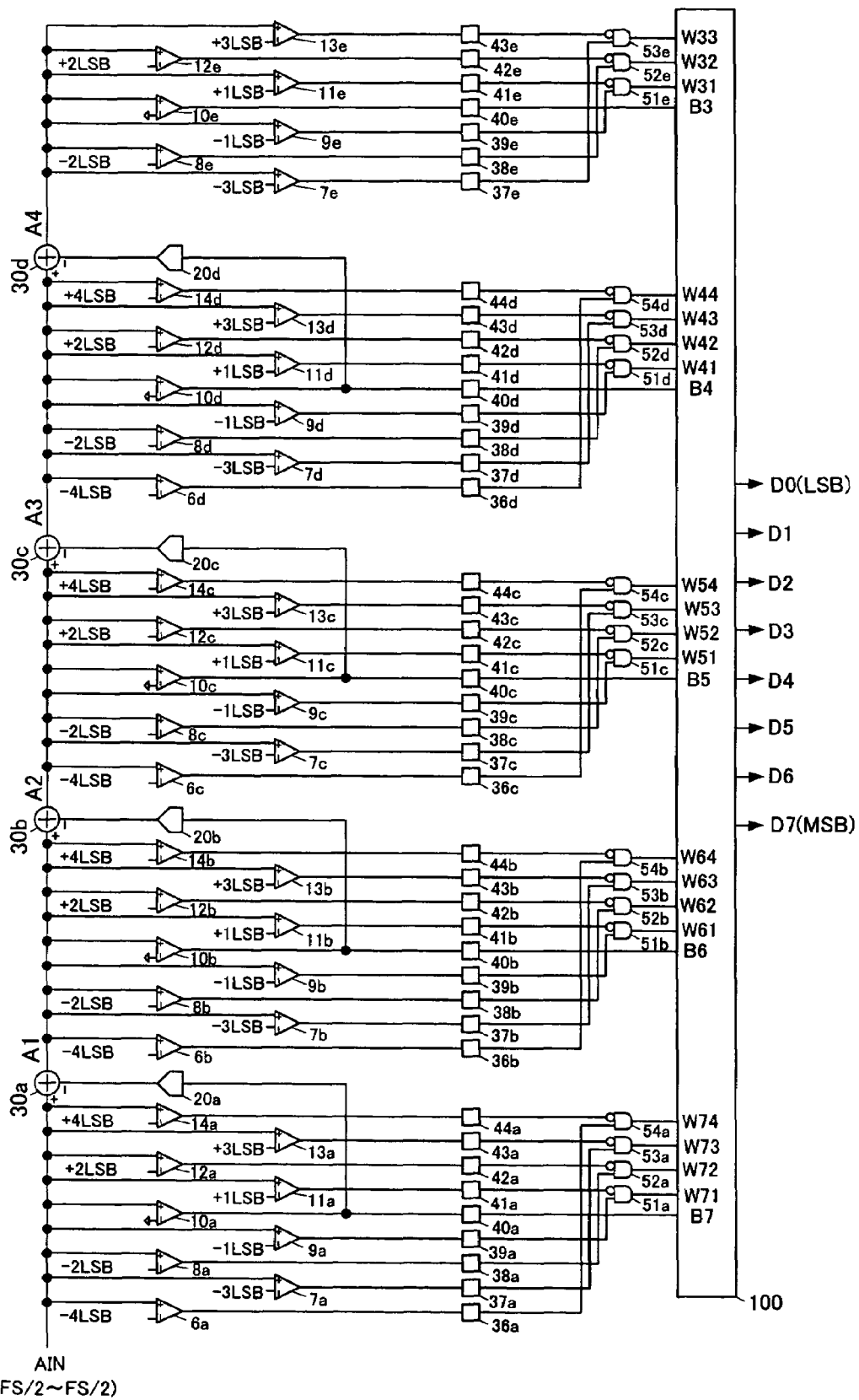
FIG. 2 is a structural view showing an embodiment of this invention.
Figure 3:
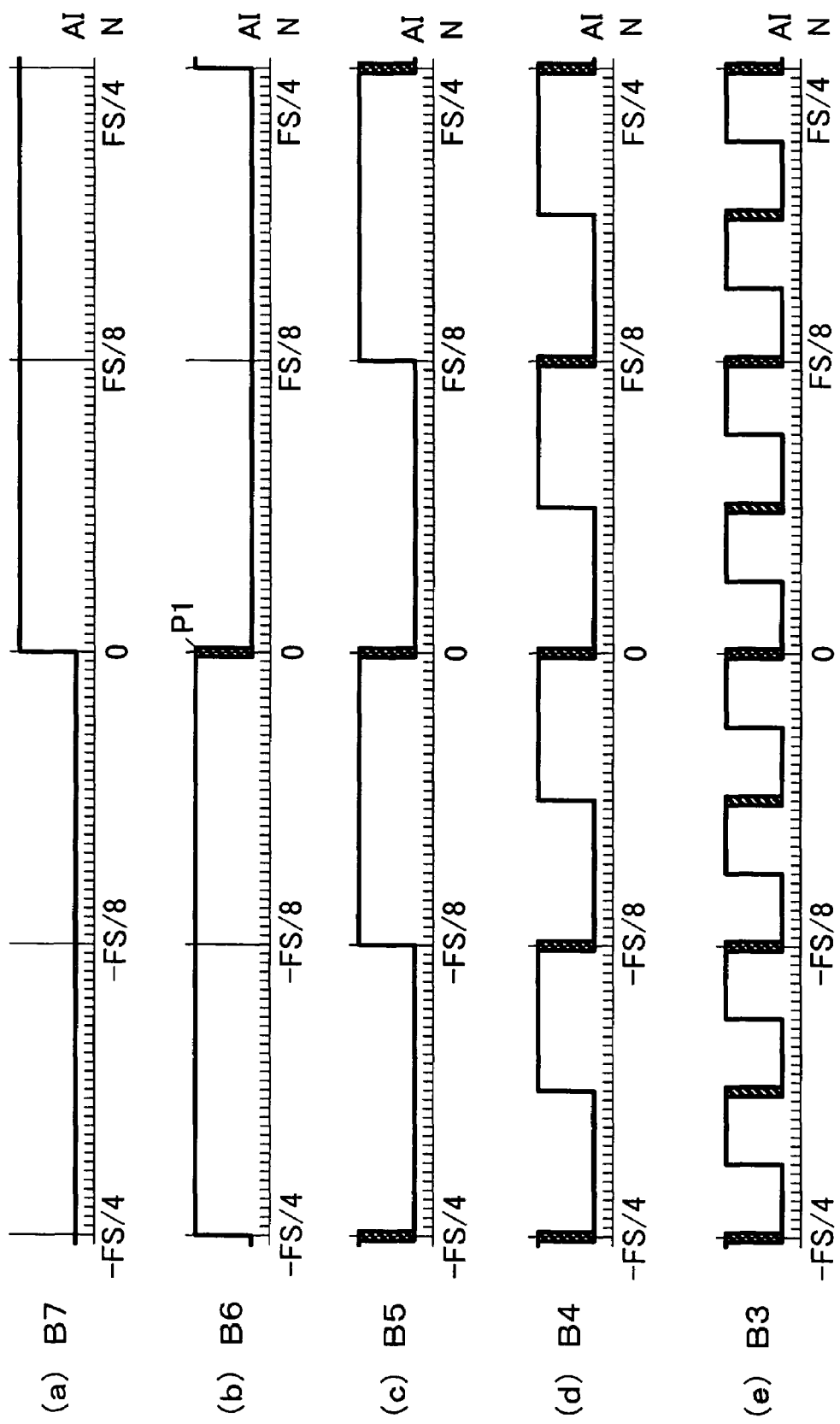
FIGS. 3A to 3E show operating waveforms in the embodiment of FIG. 2.
Figure 4:
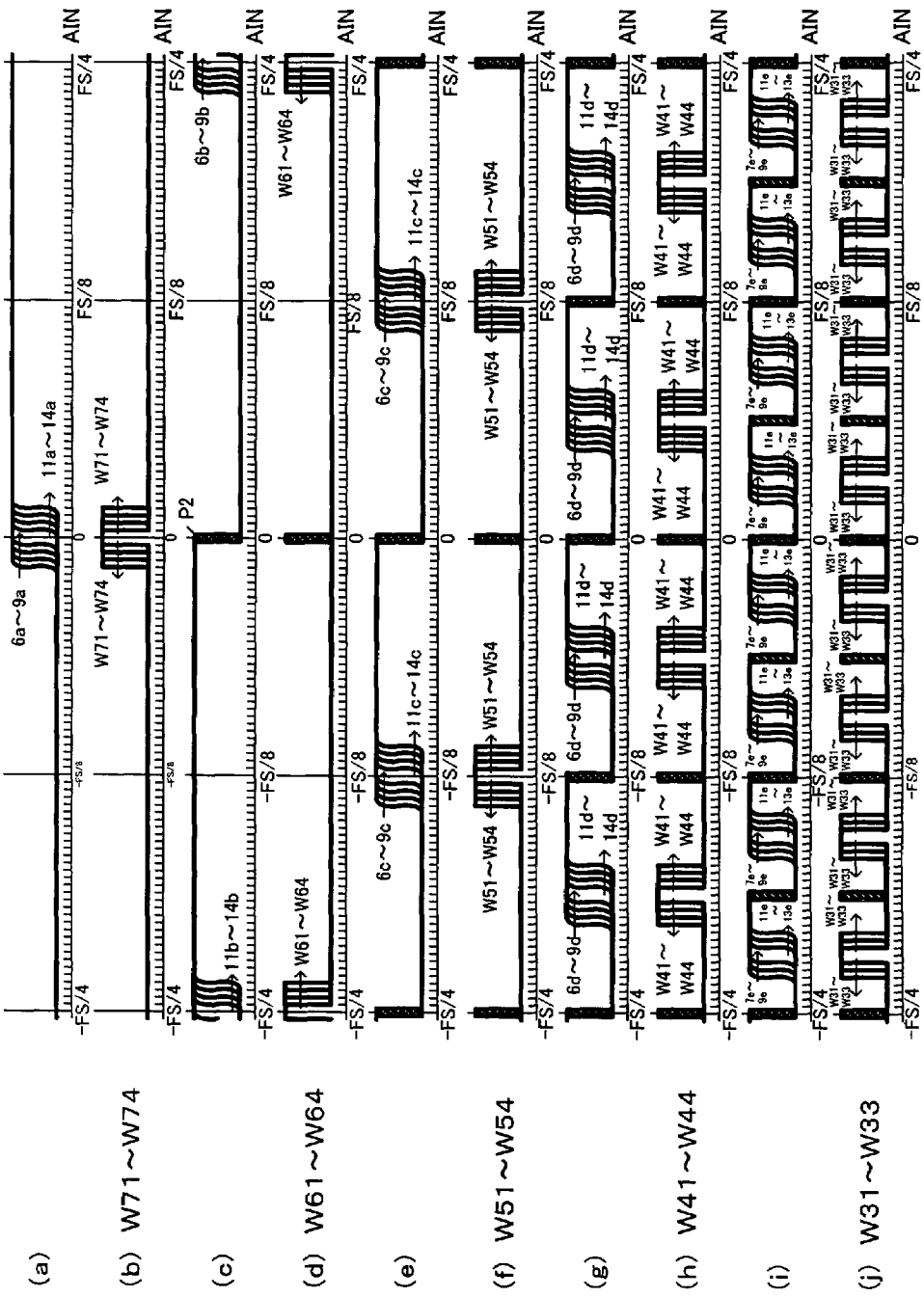
FIGS. 4A to 4J show operating waveforms in the embodiment of FIG. 2.
Figure 5:
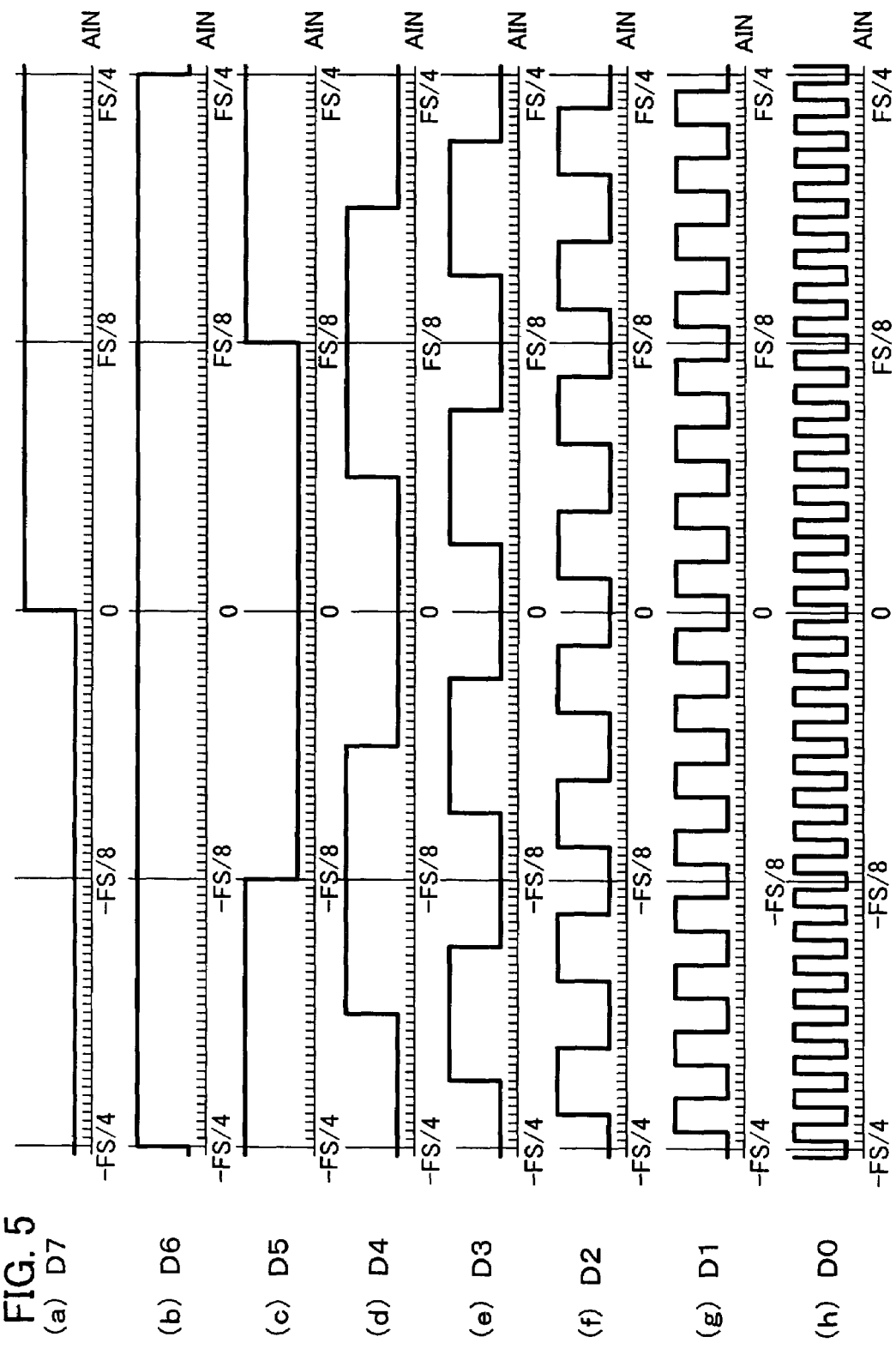
FIGS. 5A to 5H show operating waveforms in the embodiment of FIG. 2.

This invention will now be described in detail with reference to FIG. 2. FIG. 2 is a structural view showing an embodiment of this invention. The same elements as those in the conventional example of FIG. 1 are denoted by the same numerals and will not be described further in detail. An arithmetic operating unit 100 in the embodiment of FIG. 2 is equivalent to the error correcting circuit 110 in the conventional example of FIG. 1.

The embodiment of FIG. 2 is characterized by the structure of comparators (6a to 9a, 11a to 14a, 6b to 9b, 11b to 14b, 6c to 9c, 11c to 14c, 6d to 9d, and 11d to 14d), which are second comparators, and the arithmetic operating unit 100.

In FIG. 2, a voltage +1LSB is a voltage corresponding to the least significant bit LSB. A voltage +2LSB is a voltage twice as large as the voltage +1LSB. A voltage +3LSB is a voltage three times as large as the voltage +1LSB. A voltage +4LSB is a voltage four times as large as the voltage +1LSB. A voltage −1LSB, a voltage −2LSB, a voltage −3LSB and a voltage −4LSB are voltages having polarity opposite to the polarity of the voltage +1LSB, the voltage +2LSB, the voltage +3LSB and the voltage +4LSB, respectively.

The comparator 6a is a comparator for multiplication by −4 of the least significant bit LSB. Its non-inverting input is connected to an analog input signal AIN, and its inverting input is connected to the voltage −4LSB. Its output is connected to an AND circuit 54a via a latch circuit 36a.

The comparator 7a is a comparator for multiplication by −3 of the least significant bit LSB. Its non-inverting input is connected to the analog input signal AIN, and its inverting input is connected to the voltage −3LSB. Its output is connected to an AND circuit 53a via a latch circuit 37a.

The comparator 8a is a comparator for multiplication by −2 of the least significant bit LSB. Its non-inverting input is connected to the analog input signal AIN, and its inverting input is connected to the voltage −2LSB. Its output is connected to an AND circuit 52a via a latch circuit 38a.

The comparator 9a is a comparator for multiplication by −1 of the least significant bit LSB. Its non-inverting input is connected to the analog input signal AIN, and its inverting input is connected to the voltage −1LSB. Its output is connected to an AND circuit 51a via a latch circuit 39a.

The comparator 11a is a comparator for multiplication by +1 of the least significant bit LSB. Its non-inverting input is connected to the analog input signal AIN, and its inverting input is connected to the voltage +1LSB. Its output is connected to the AND circuit 51a via a latch circuit 41a and an inverting unit.

The comparator 12a is a comparator for multiplication by +2 of the least significant bit LSB. Its non-inverting input is connected to the analog input signal AIN, and its inverting input is connected to the voltage +2LSB. Its output is connected to the AND circuit 52a via a latch circuit 42a and an inverting unit.

The comparator 13a is a comparator for multiplication by +3 of the least significant bit LSB. Its non-inverting input is connected to the analog input signal AIN, and its inverting input is connected to the voltage +3LSB. Its output is connected to the AND circuit 53a via a latch circuit 43a and an inverting unit.

The comparator 14a is a comparator for multiplication by +4 of the least significant bit LSB. Its non-inverting input is connected to the analog input signal AIN, and its inverting input is connected to the voltage +4LSB. Its output is connected to the AND circuit 54a via a latch circuit 44a and an inverting unit.

An output W71 of the AND circuit 51a, an output W72 of the AND circuit 52a, an output W73 of the AND circuit 53a and an output W74 of the AND circuit 54a are connected to the arithmetic operating unit 100.

The comparators (6a to 14a), a D/A converter 20a, a subtractor 30a, the latch circuits (36a to 44a), the AND circuits (51a to 54a) and the inverting units form a first fundamental constituent element ADA.

Similarly, the comparator 6b is a comparator for multiplication by −4 of the least significant bit LSB. Its non-inverting input is connected to an output A1 of the subtractor 30a, and its inverting input is connected to the voltage −4LSB. Its output is connected to an AND circuit 54b via a latch circuit 36b.

The comparator 7b is a comparator for multiplication by −3 of the least significant bit LSB. Its non-inverting input is connected to the output A1 of the subtractor 30a, and its inverting input is connected to the voltage −3LSB. Its output is connected to an AND circuit 53b via a latch circuit 37b.

The comparator 8b is a comparator for multiplication by −2 of the least significant bit LSB. Its non-inverting input is connected to the output A1 of the subtractor 30a, and its inverting input is connected to the voltage −2LSB. Its output is connected to an AND circuit 52b via a latch circuit 38b.

The comparator 9b is a comparator for multiplication by −1 of the least significant bit LSB. Its non-inverting input is connected to the output A1 of the subtractor 30a, and its inverting input is connected to the voltage −1LSB. Its output is connected to an AND circuit 51b via a latch circuit 39b.

The comparator 11b is a comparator for multiplication by +1 of the least significant bit LSB. Its non-inverting input is connected to the output A1 of the subtractor 30a, and its inverting input is connected to the voltage +1LSB. Its output is connected to the AND circuit 51b via a latch circuit 41b and an inverting unit.

The comparator 12b is a comparator for multiplication by +2 of the least significant bit LSB. Its non-inverting input is connected to the output A1 of the subtractor 30a, and its inverting input is connected to the voltage +2LSB. Its output is connected to the AND circuit 52b via a latch circuit 42b and an inverting unit.

The comparator 13b is a comparator for multiplication by +3 of the least significant bit LSB. Its non-inverting input is connected to the output A1 of the subtractor 30a, and its inverting input is connected to the voltage +3LSB. Its output is connected to the AND circuit 53b via a latch circuit 43b and an inverting unit.

The comparator 14b is a comparator for multiplication by +4 of the least significant bit LSB. Its non-inverting input is connected to the output A1 of the subtractor 30a, and its inverting input is connected to the voltage +4LSB. Its output is connected to the AND circuit 54b via a latch circuit 44b and an inverting unit.

An output W61 of the AND circuit 51b, an output W62 of the AND circuit 52b, an output W63 of the AND circuit 53b and an output W64 of the AND circuit 54b are connected to the arithmetic operating unit 100.

The comparators (6b to 14b), a D/A converter 20b, a subtractor 30b, the latch circuits (36b to 44b), the AND circuits (51b to 54b) and the inverting units form a second fundamental constituent element ADA.

The first fundamental constituent element ADA and the second fundamental constituent element ADA are cascaded with each other.

Similarly, the first fundamental constituent element ADA, the second fundamental constituent element ADA, a third fundamental constituent element ADA formed by comparators (6c to 14c), a D/A converter 20c, a subtractor 30c, latch circuits (36c to 44c), AND circuits (51c to 54c) and inverting units, and a fourth fundamental constituent element ADA formed by comparators (6d to 14d), a D/A converter 20d, a subtractor 30d, latch circuits (36d to 44d), AND circuits (51d to 54d) and inverting units, are cascaded.

That is, in the embodiment of FIG. 2, the fundamental constituent elements are connected in four stages. On the stage subsequent to the fundamental constituent elements, the following structure is provided.

A comparator 7e is a comparator for multiplication by −3 of the least significant bit LSB. Its non-inverting input is connected to an output A4 of the subtractor 30d, and its inverting input is connected to the voltage −3LSB. Its output is connected to an AND circuit 53e via a latch circuit 37e.

A comparator 8e is a comparator for multiplication by −2 of the least significant bit LSB. Its non-inverting input is connected to the output A4 of the subtractor 30d, and its inverting input is connected to the voltage −2LSB. Its output is connected to an AND circuit 52e via a latch circuit 38e.

A comparator 9e is a comparator for multiplication by −1 of the least significant bit LSB. Its non-inverting input is connected to the output A4 of the subtractor 30d, and its inverting input is connected to the voltage −1LSB. Its output is connected to an AND circuit 51e via a latch circuit 39e.

A comparator 11e is a comparator for multiplication by +1 of the least significant bit LSB. Its non-inverting input is connected to the output A4 of the subtractor 30d, and its inverting input is connected to the voltage +1LSB. Its output is connected to the AND circuit 51e via a latch circuit 41e and an inverting unit.

A comparator 12e is a comparator for multiplication by +2 of the least significant bit LSB. Its non-inverting input is connected to the output A4 of the subtractor 30d, and its inverting input is connected to the voltage +2LSB. Its output is connected to the AND circuit 52e via a latch circuit 42e and an inverting unit.

A comparator 13e is a comparator for multiplication by +3 of the least significant bit LSB. Its non-inverting input is connected to the output A4 of the subtractor 30d, and its inverting input is connected to the voltage +3LSB. Its output is connected to the AND circuit 53e via a latch circuit 43e and an inverting unit.

An output W31 of the AND circuit 51e, an output W32 of the AND circuit 52e and an output W33 of the AND circuit 53e are connected to the arithmetic operating unit 100.

Moreover, the arithmetic operating unit 100 executes calculations for error correction and encoding based on the following logical expressions (9) to (16) and outputs digital signals D7 (most significant bit MSB) to D0 (least significant bit LSB). That is, in the embodiment of FIG. 2, digital signals (D7 to D0) of 8-bit gray codes are outputted.

$$D7 = B7 \tag{9}$$

$$D6 = (B7 \text{ xor } B6) \text{ or } W74 \tag{10}$$

$$D5 = \{(B6 \text{ xor } B5) \text{ or } W64\} \text{ and not } (W74) \tag{11}$$

$$D4 = \{(B5 \text{ xor } B4) \text{ or } W54\} \text{ and not } (W74) \text{ and not } (W64) \tag{12}$$

$$D3 = \{(B4 \text{ xor } B3) \text{ or } W44\} \text{ and not } (W74) \text{ and not } (W64) \text{ and not } (W54) \tag{13}$$

$$D2 = \text{not } (W74 \text{ or } W64 \text{ or } W54 \text{ or } W44) \tag{14}$$

$$D1 = \text{not } (W72 \text{ or } W62 \text{ or } W52 \text{ or } W42 \text{ or } W32) \tag{15}$$

$$D0 = (W73 \text{ or } W63 \text{ or } W53 \text{ or } W43 \text{ or } W33) \text{ and not } (W71 \text{ or } W61 \text{ or } W51 \text{ or } W41 \text{ or } W31) \tag{16}$$

The operation in the embodiment of FIG. 2 having the above-described structure will be described with reference to FIGS. 3A to 5H. FIGS. 3A to 5H show operating waveforms in the embodiment of FIG. 2. The horizontal axes represent the analog input signal AIN within a range from −¼ of a full scale FS (i.e., −FS/4) to +¼ of the full scale (i.e., FS/4). That is, each of the operating waveforms shown in FIGS. 3A to 5H represents a half of the full scale FS of the analog input signal AIN.

FIG. 3A shows the waveform of the output B7 of the latch circuit 40a. FIG. 3B shows the waveform of the output B6 of the latch circuit 40b. FIG. 3C shows the waveform of the output B5 of the latch circuit 40c. FIG. 3D shows the waveform of the output B4 of the latch circuit 40d. FIG. 3E shows the waveform of the output B3 of the latch circuit 40e.

FIG. 4A shows the waveform of the outputs of the comparators (6a to 9a and 11a to 14a). FIG. 4B shows the waveform of the outputs (W71 to W74) of the AND circuits (51a to 54a). FIG. 4C shows the waveform of the outputs of the comparators (6b to 9b and 11b to 14b). FIG. 4D shows the waveform of the outputs (W61 to W64) of the AND circuits (51b to 54b).

FIG. 4E shows the waveform of the outputs of the comparators (6c to 9c and 11c to 14c). FIG. 4F shows the waveform of the outputs (W51 to W54) of the AND circuits (51c to 54c).

FIG. 4G shows the waveform of the outputs of the comparators (6d to 9d and 11d to 14d). FIG. 4H shows the waveform of the outputs (W41 to W44) of the AND circuits (51d to 54d).

FIG. 4I shows the waveform of the outputs of the comparators (7e to 9e and 11e to 13e). FIG. 4J shows the waveform of the outputs (W31 to W33) of the AND circuits (51e to 53e).

FIG. 5A shows the waveform of the digital signal D7. FIG. 5B shows the waveform of the digital signal D6. FIG. 5C shows the waveform of the digital signal D5. FIG. 5D shows the waveform of the digital signal D4. FIG. 5E shows the waveform of the digital signal D3. FIG. 5F shows the waveform of the digital signal D2. FIG. 5G shows the waveform of the digital signal D1. FIG. 5H shows the waveform of the digital signal D0.

The waveforms shown in FIGS. 3A to 3E show that the arithmetic operating unit 100 acquires the signals of the upper five bits from the outputs (B6 to B3) of the fundamental constituent elements ADA cascaded in four stages.

The outputs (B6 to B3) have regions P1 where the outputs are undefined, at transition points from 0 to 1 and transition points from 1 to 0.

The waveforms shown in FIGS. 4A and 4B show that A/D conversion is performed every least significant bit LSB in the region from −4LSB to +4LSB near the transition point from 0 to 1 and near the transition point from 1 to 0 of the digital signal D7.

Similarly, the waveforms shown in FIGS. 4C and 4D show that A/D conversion is performed every least significant bit LSB in the region from −4LSB to +4LSB near the transition point from 0 to 1 and near the transition point from 1 to 0 of the digital signal D6.

Similarly, the waveforms shown in FIGS. 4E and 4F show that A/D conversion is performed every least significant bit LSB in the region from −4LSB to +4LSB near the transition point from 0 to 1 and near the transition point from 1 to 0 of the digital signal D5.

Similarly, the waveforms shown in FIGS. 4G and 4H show that A/D conversion is performed every least significant bit LSB in the region from −4LSB to +4LSB near the transition point from 0 to 1 and near the transition point from 1 to 0 of the digital signal D4.

Similarly, the waveforms shown in FIGS. 4I and 4J show that A/D conversion is performed every least significant bit LSB in the region from −3LSB to +3LSB near the transition point from 0 to 1 and near the transition point from 1 to 0 of the digital signal D3.

Therefore, the comparators (6a to 9a, 11a to 14a, 6b to 9b, 11b to 14b, 6c to 9c, 11c to 14c, 6d to 9d, 11d to 14d, 7e to 9e, and 11e to 13e) in the embodiment of FIG. 2 perform A/D conversion of the lower three bits in such a manner as to interpolate the transition point from 0 to 1 and the transition point from 1 to 0 of the upper five bits.

The arithmetic operating unit 100 interpolates the lower three bits on the basis of the outputs (W61 to W64, W51 to W54, W41 to W44, and W31 to W33) based on the outputs of the comparators (6b to 9b, 11b to 14b, 6c to 9c, 11c to 14c, 6d to 9d, 11d to 14d, 7e to 9e, and 11e to 13e).

The outputs of the comparators (6b to 9b, 11b to 14b, 6c to 9c, 11c to 14c, 6d to 9d, 11d to 14d, 7e to 9e, and 11e to 13e) and the outputs (W61 to W64, W51 to W54, W41 to W44, and W31 to W33) have regions P2 where the outputs are undefined, respectively.

As described above, in the embodiment of FIG. 2, an 8-bit cascade A/D converter is formed in which the fundamental constituent elements ADA are cascaded in four stages. In the embodiment of FIG. 2, the fundamental constituent elements ADA are cascaded in four stages, whereas in the conventional example of FIG. 1, the fundamental constituent elements ADA are cascaded in six stages.

Therefore, in the embodiment of FIG. 2, the settling time is reduced because of the fewer stages of the fundamental constituent elements ADA.

FIGS. 6A to 6H show operating waveforms in the embodiment of FIG. 2. The horizontal axes in FIGS. 6A to 6H represent the analog input signal AIN within a range from −½ of the full scale FS (i.e., −FS/2) to −⅜ of the full scale FS (i.e., −3FS/8).

Figure 6:
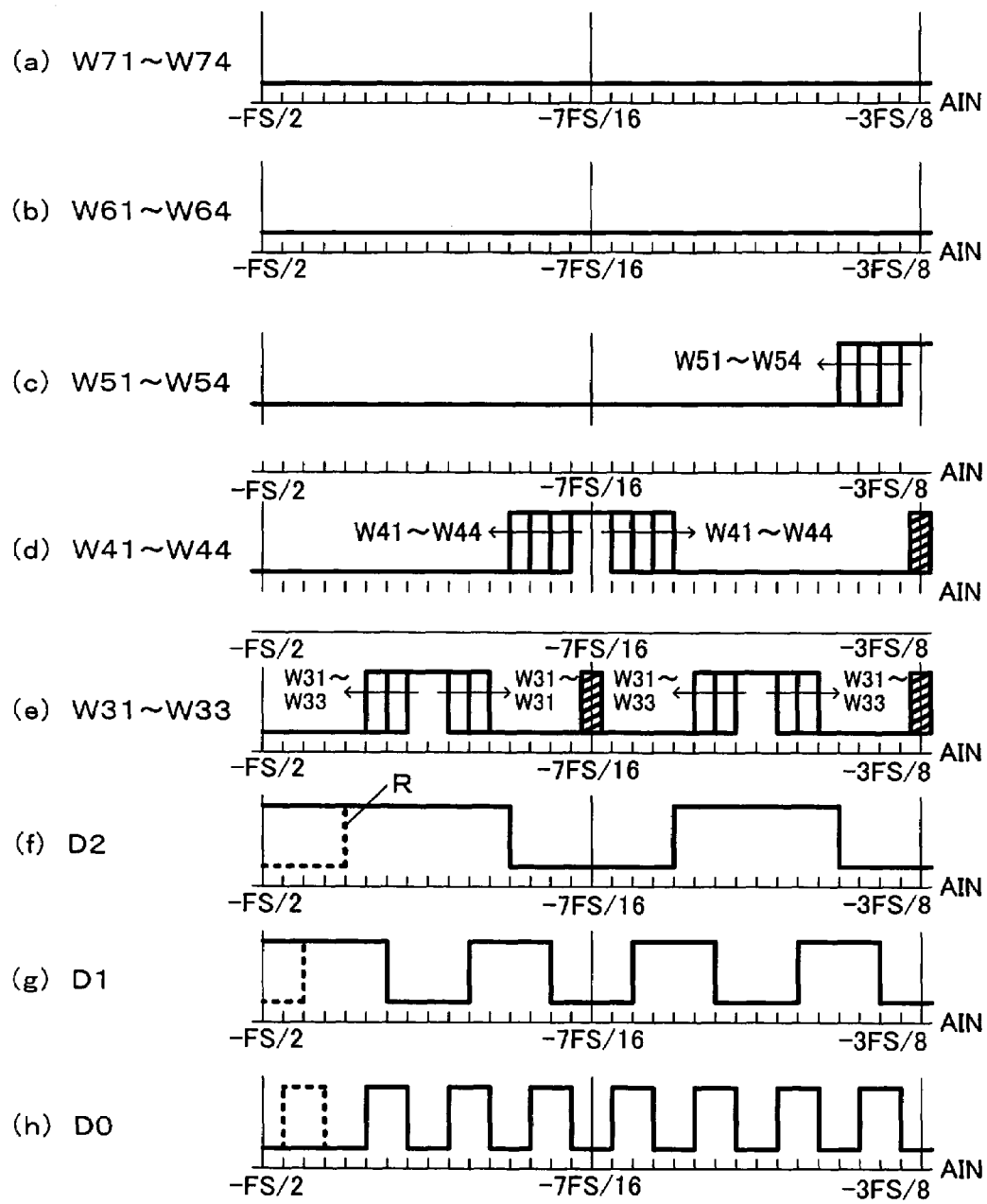
FIGS. 6A to 6H show operating waveforms in the embodiment of FIG. 2.

FIG. 6A shows the waveform of the outputs (W71 to W74) of the AND circuits (51a to 54a), corresponding to FIG. 4B.

FIG. 6B shows the waveform of the outputs (W61 to W64) of the AND circuits (51b to 54b), corresponding to FIG. 4D.

FIG. 6C shows the waveform of the outputs (W51 to W54) of the AND circuits (51c to 54c), corresponding to FIG. 4F.

FIG. 6D shows the waveform of the outputs (W41 to W44) of the AND circuits (51d to 54d), corresponding to FIG. 4H.

FIG. 6E shows the waveform of the outputs (W31 to W33) of the AND circuits (51e to 53e), corresponding to FIG. 4J.

FIG. 6F shows the waveform of the digital signal D2, corresponding to FIG. 5F.

FIG. 6G shows the waveform of the digital signal D1, corresponding to FIG. 5G.

FIG. 6H shows the waveform of the digital signal D0, corresponding to FIG. 5H.

In FIGS. 6F to 6H, broken lines R represent characteristics proper to the gray codes. That is, FIGS. 6F to 6H show that codes 0 to 3 cannot be acquired in the embodiment of FIG. 2.

Specifically, in the embodiment of FIG. 2, there are codes that cannot be acquired at the lower end of the full scale FS and the upper end of the full scale FS. More specifically, in the embodiment of FIG. 2, codes 0 to 3 and codes 252 to 255 cannot be acquired.

Such an embodiment as shown in FIG. 2 has a defect that a part of the codes are missing. However, since the missing codes are limited to the very small regions at both ends, it can operate without any trouble in most applications.

Therefore, in the embodiment of FIG. 2, the minimum number of comparators (6a to 9a, 11a to 14a, 6b to 9b, 11b to 14b, 6c to 9c, 11c to 14c, 6d to 9d, 11d to 14d, 7e to 9e, and 11e to 13e) necessary for practical applications are arranged, thus realizing lower cost and smaller size.

Figure 7:
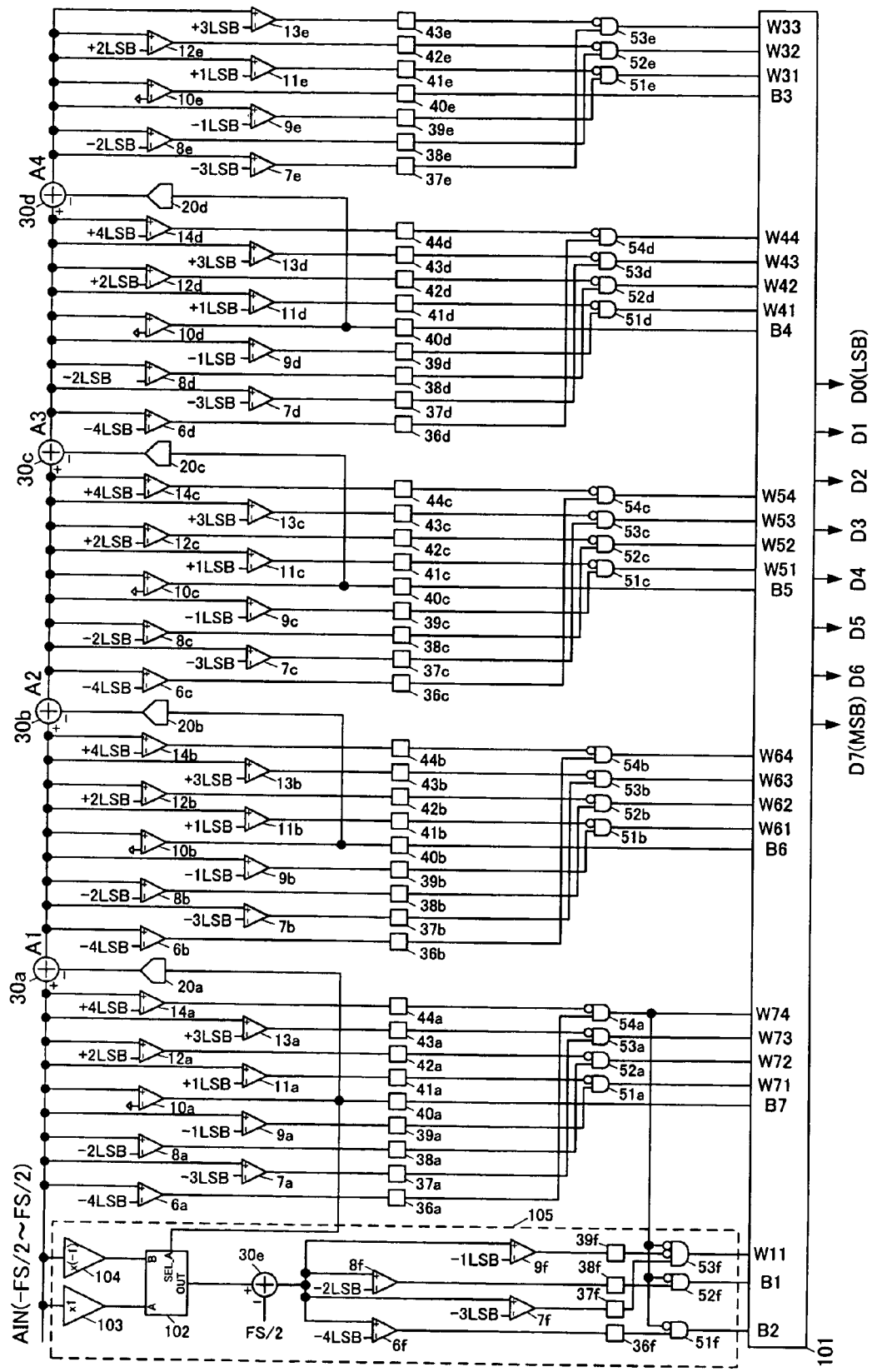
FIG. 7 is a structural view showing another embodiment of this invention.

FIG. 7 is a structural view showing another embodiment of this invention. The same elements as those in the embodiment of FIG. 2 are denoted by the same numerals and will not be described further in detail. An arithmetic operating unit 101 in the embodiment of FIG. 7 is equivalent to the arithmetic operating unit 100 in the embodiment of FIG. 2.

The embodiment of FIG. 7 is characterized by having an auxiliary A/D converter 105.

In FIG. 7, the input of a non-inverting amplifier 103 and the input of an inverting amplifier 104 are connected to an analog input signal AIN.

At an analog multiplexer 102, its input A is connected to an output of the non-inverting amplifier 103, and its input B is connected to an output of the inverting amplifier 104. Its input SEL_A is connected to the output of a comparator 10a.

At a subtractor 30e, its addition input is connected to an output OUT of the analog multiplexer 102, and its subtraction input is connected to a voltage FS/2 corresponding to ½ of the full scale FS.

A comparator 6f is a comparator for multiplication by four of the least significant bit LSB. Its non-inverting input is connected to an output of the subtractor 30e, and its inverting input is connected to a voltage −4LSB. Its output is connected to an AND circuit 51f via a latch circuit 36f.

A comparator 7f is a comparator for multiplication by three of the least significant bit LSB. Its non-inverting input is connected to the output of the subtractor 30e, and its inverting input is connected to a voltage −3LSB. Its output is connected to an AND circuit 53f via a latch circuit 37f.

A comparator 8f is a comparator for multiplication by two of the least significant bit LSB. Its non-inverting input is connected to the output of the subtractor 30e, and its inverting input is connected to a voltage −2LSB. Its output is connected to an AND circuit 52f via a latch circuit 38f.

A comparator 9f is a comparator for multiplication by one of the least significant bit LSB. Its non-inverting input is connected to the output of the subtractor 30e, and its inverting input is connected to a voltage −1LSB. Its output is connected to the AND circuit 53f via a latch circuit 39f and an inverting unit.

An output W74 is connected to the AND circuit 51f via an inverting unit. The output W74 is also connected to the AND circuit 52f via an inverting unit. The output W74 is also connected to the AND circuit 53f via an inverting unit.

An output B2 of the AND circuit 51f, an output B1 of the AND circuit 52f and an output W11 of the AND circuit 53f are connected to the arithmetic operating unit 101.

The non-inverting amplifier 103, the inverting amplifier 104, the analog multiplexer 102, the subtractor 30e, the comparators (6f to 9f), the latch circuits (36f to 39f) and the AND circuits (51f to 53f) form the auxiliary A/D converter 105.

The auxiliary A/D converter 105 operates in parallel with a structure having fundamental constituent elements ADA cascaded in plural stages. It operates at a higher speed than the structure having fundamental constituent elements ADA cascaded in plural stages (i.e., structure equivalent to the embodiment of FIG. 2).

Specifically, the delay at the auxiliary A/D converter 105 is of a small value based on the non-inverting amplifier 103, the inverting amplifier 104, the analog multiplexer 102, the subtractor 30e, the comparators (6f to 9f), the latch circuits (36f to 39f) and the AND circuits (51f to 53f), whereas the delay in the structure having fundamental constituent elements ADA cascaded in plural stages is of a large value based on the comparators (10a to 10e), the D/A converters (20a to 20d), the subtractors (30a to 30d), the latch circuits (37e to 43e) and the AND circuits (51e to 53e).

The arithmetic operating unit 101 executes calculation for error correction and encoding based on the following logical expressions (17) to (24) and outputs digital signals D7 (most significant bit MSB) to D0 (least significant bit LSB) That is, in the embodiment of FIG. 7, digital signals (D7 to D0) of 8-bit gray codes are outputted.

$$D7 = B7 \tag{17}$$

$$D6 = (B7 \text{ xor } B6) \text{ or } W74 \tag{18}$$

$$D5 = \{(B6 \text{ xor } B5) \text{ or } W64\} \text{ and not } (W74) \tag{19}$$

$$D4 = \{(B5 \text{ xor } B4) \text{ or } W54\} \text{ and not } (W74) \text{ and not } (W64) \tag{20}$$

$$D3 = \{(B4 \text{ xor } B3) \text{ or } W44\} \text{ and not } (W74) \text{ and not } (W64) \text{ and not } (W54) \tag{21}$$

$$D2 = \text{not } (W74 \text{ or } W64 \text{ or } W54 \text{ or } W44) \text{ and not } (B2) \tag{22}$$

D1=not (W72 or W62 or W52 or W42 or W32) and not (B2)   (23)

D0= (W73 or W63 or W53 or W43 or W33) and not (W71 or W61 or W51 or W41 or W31) or W11   (24)

Here, the operations of the analog multiplexer 102 and the subtractor 30e with reference to FIGS. 8A to 8D. FIGS. 8A to 8D show operating waveforms in the embodiment of FIG. 7. In FIGS. 8A to 8D, the horizontal axes represent the analog input signal AIN within a range from −½ of the full scale FS (i.e., −FS/2) to +½ of the full scale FS (i.e., FS/2).

Figure 8:
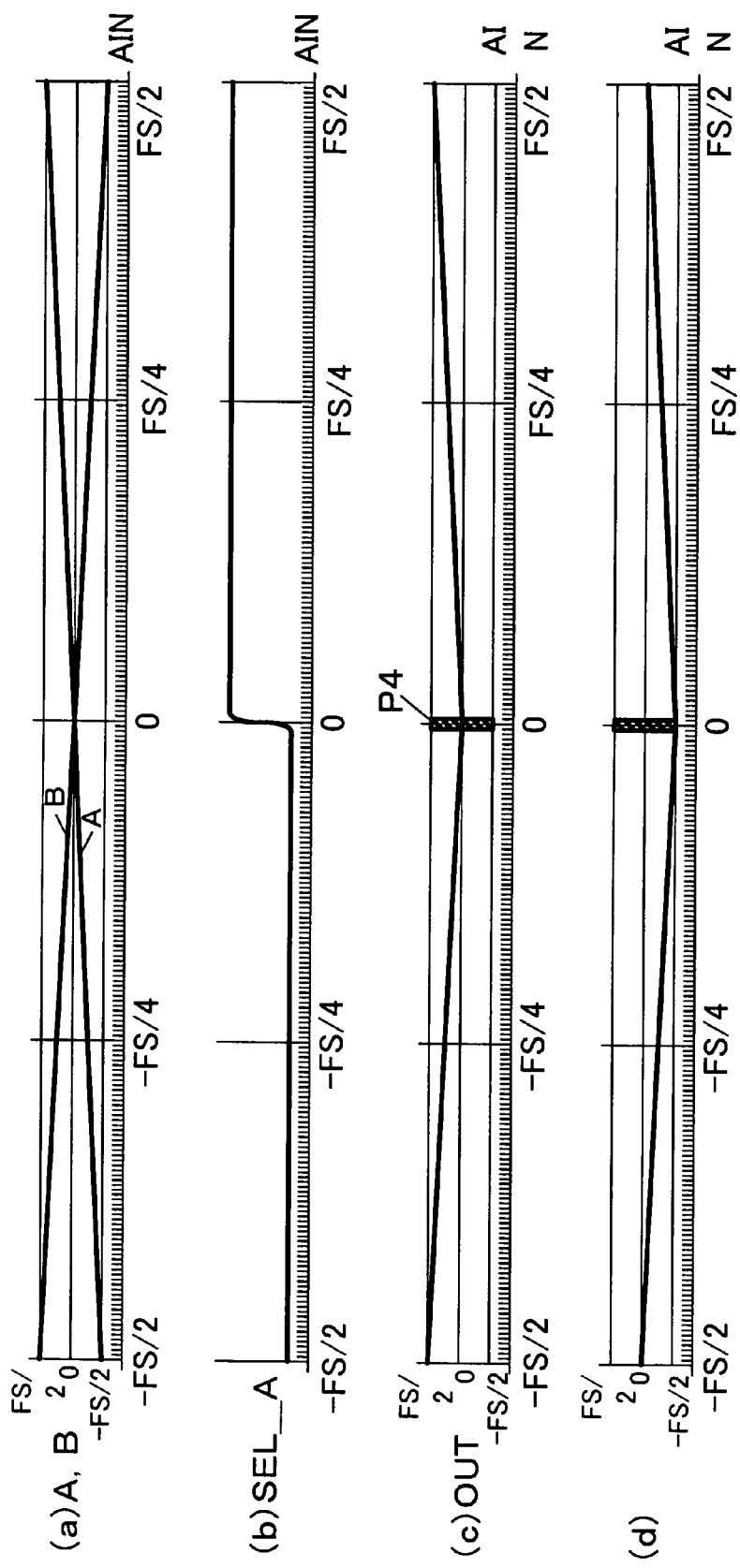
FIGS. 8A to 8D show operating waveforms in the embodiment of FIG. 7.

FIG. 8A shows the waveforms of the input A of the analog multiplexer 102 and the input B of the analog multiplexer 102. FIG. 8B shows the waveform of the input SEL_A of the analog multiplexer 102. FIG. 8C shows the waveform of the output OUT of the analog multiplexer 102. FIG. 8D shows the waveform of the output of the subtractor 30e.

As shown in FIGS. 8A to 8C, when the input SEL_A is at high level, the analog multiplexer 102 outputs the value of the input A as the output OUT, and when the input SEL_A is at low level, the analog multiplexer 102 outputs the value of the input B as the output OUT.

The subtractor 30e subtracts the voltage FS/2 from the output OUT and shifts the level of the output OUT. The output of the subtractor 30e is 0 when the analog input signal AIN is −FS/2, and the output of the subtractor 30e is 0 when the input analog signal AIN is FS/2, as shown in FIG. 8D.

Therefore, the analog multiplexer 102 switches the vicinity of the lower end of the range and the vicinity of the upper end of the range. In the embodiment of FIG. 7, with this structure, the number of constituent elements is reduced, and simplification, lower cost and smaller size are realized.

The operation in the embodiment of FIG. 7, constructed as described above, will now be described with reference to FIGS. 9A to 9L and FIGS. 10A to 10L. FIGS. 9A to 9L and FIGS. 10A to 10L show operating waveforms in the embodiment of FIG. 7. In FIGS. 9A to 9L, the horizontal axes represent the vicinity of the lower end of the analog input signal AIN within a range from −½ of the full scale FS (i.e., −FS/2) to −⅜ of the full scale FS (i.e., −3FS/8). In FIGS. 10A to 10L, the horizontal axes represent the vicinity of the upper end of the analog input signal AIN within a range from +⅜ of the full scale FS (i.e., 3FS/8) to +½ of the full scale FS (i.e., FS/2).

Figure 9:
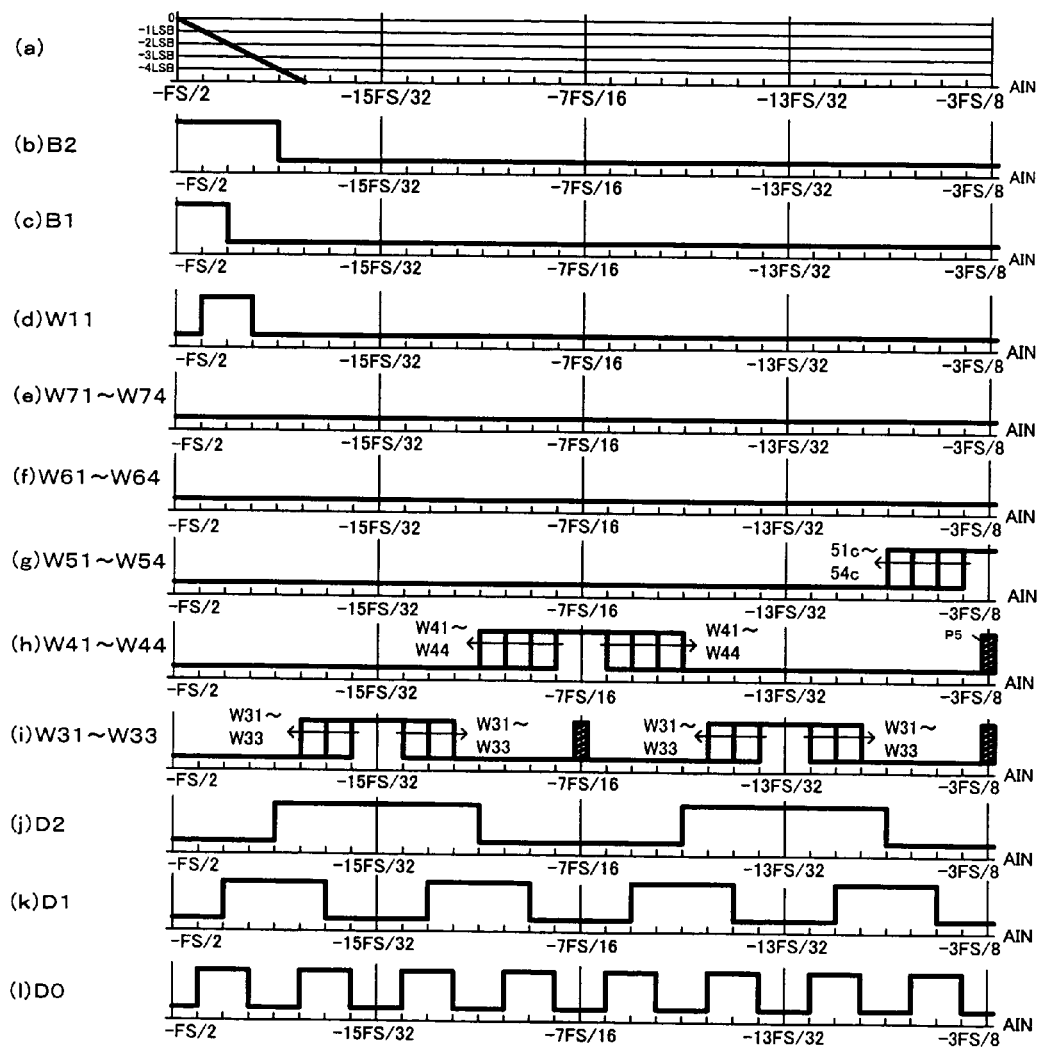
FIGS. 9A to 9L show operating waveforms in the embodiment of FIG. 7.
Figure 10:
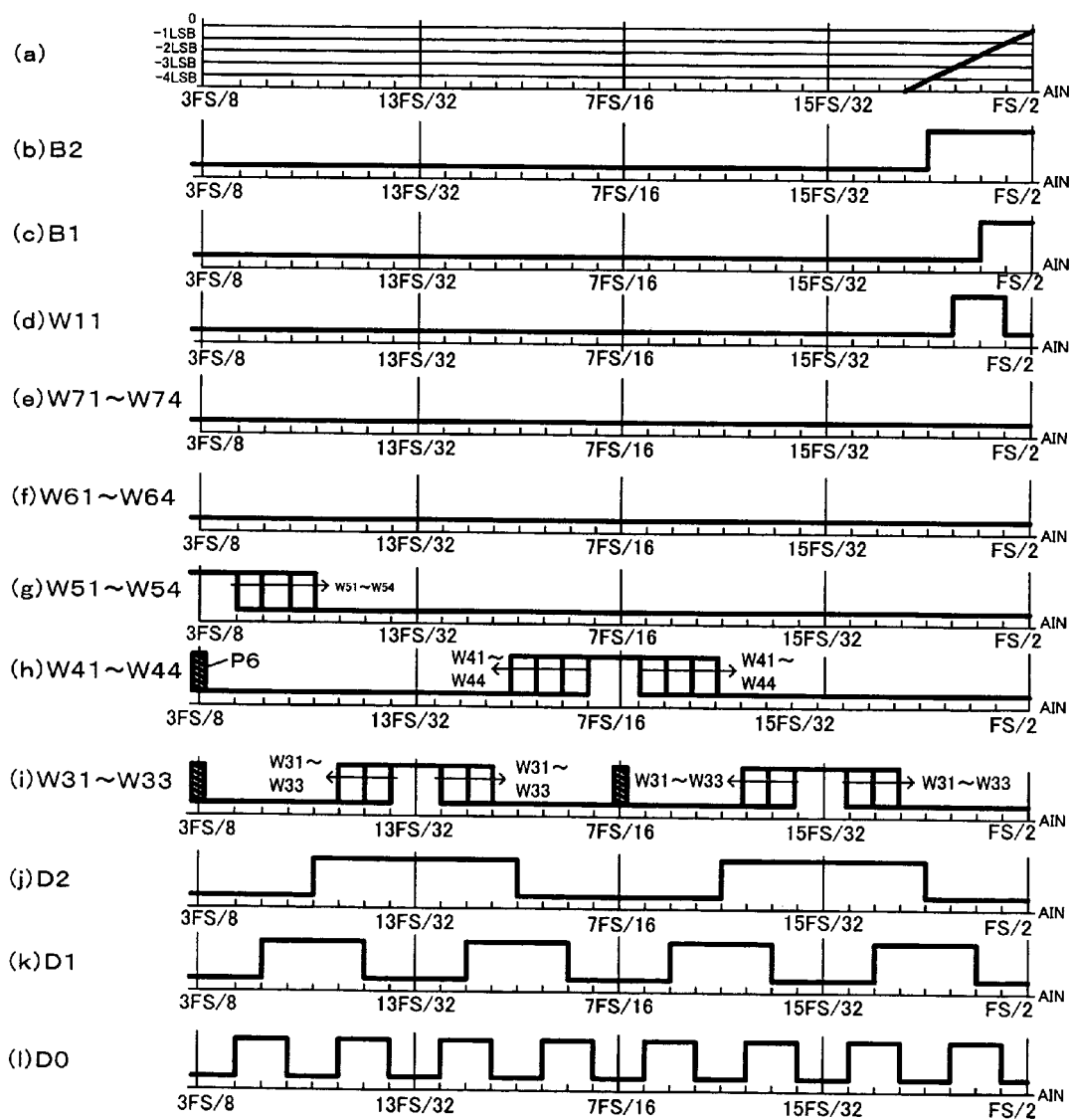
FIGS. 10A to 10L show operating waveforms in the embodiment of FIG. 7.

FIGS. 9A and 10A show the waveform of the output of the subtractor 30e, corresponding to FIG. 8D. FIGS. 9B and 10B show the waveform of the output B2 of the AND circuit 51f. FIGS. 9C and 10C show the waveform of the output B1 of the AND circuit 52f. FIGS. 9D and 10D show the waveform of the output W11 of the AND circuit 53f.

FIGS. 9E and 10E show the waveform of the outputs (W71 to W74), corresponding to FIG. 6A. FIGS. 9F and 10F show the waveform of the outputs (W61 to W64), corresponding to FIG. 6B. FIGS. 9G and 10G show the waveform of the outputs (W51 to W54), corresponding to FIG. 6C. FIGS. 9H and 10H show the waveform of the outputs (W41 to W44), corresponding to FIG. 6D. FIGS. 9I and 10I show the waveform of the outputs (W31 to W33), corresponding to FIG. 6E.

FIGS. 9J and 10J show the waveform of the digital signal D2, corresponding to FIG. 6F. FIGS. 9K and 10K show the waveform of the digital signal D1, corresponding to FIG. 6G. FIGS. 9L and 10L show the waveform of the digital signal D0, corresponding to FIG. 6H.

First, the operation in the vicinity of the lower end of the range in the embodiment of FIG. 7 will be described with reference to FIGS. 9A to 9L. As shown in FIG. 9A, the output of the subtractor 30e is 0 when the analog input signal AIN is at a voltage −FS/2, and it decreases with the increase of the analog input signal AIN.

When the analog input signal AIN increases from the voltage −FS/2 by a voltage +1LSB, the output of the subtractor 30e increases from 0 by a voltage −1LSB. The output of the comparator 9f changes from high level to low level, and the output W11 changes from low level to high level.

When the analog input signal AIN increases from the voltage −FS/2 by a voltage +2LSB, the output of the subtractor 30e increases from 0 by a voltage −2LSB. The output of the comparator 8f changes from high level to low level, and the output B1 changes from high level to low level.

When the analog input signal AIN increases from the voltage −FS/2 by a voltage +3LSB, the output of the subtractor 30e increases from 0 by a voltage −3LSB. The output of the comparator 7f changes from high level to low level, and the output W11 changes from high level to low level.

When the analog input signal AIN increase from the voltage −FS/2 by a voltage +4LSB, the output of the subtractor 30e increases from 0 by a voltage −4LSB. The output of the comparator 6f changes from high level to low level, and the output B2 changes from high level to low level.

That is, in the vicinity of the lower end of the range in the embodiment of FIG. 7, the comparators (6f to 9f) perform A/D conversion every least significant bit LSB. The arithmetic operating unit 101 in the embodiment of FIG. 7 interpolates the lower three bits.

Therefore, in the embodiment of FIG. 7, correct codes 252 to 255 can be acquired, as shown in FIGS. 9J to 9L.

Next, the operation in the vicinity of the upper end of the range in the embodiment of FIG. 7 will be described with reference to FIGS. 10A to 10L. As shown in FIG. 10A, the output of the subtractor 30e is 0 when the analog input signal AIN is at a voltage FS/2, and it increases with the decrease of the analog input signal AIN.

When the analog input signal AIN increases from the voltage FS/2 by a voltage −1LSB, the output of the subtractor 30e increases from 0 by a voltage −1LSB. The output of the comparator 9f changes from high level to low level, and the output W11 changes from low level to high level.

When the analog input signal AIN increases from the voltage FS/2 by a voltage −2LSB, the output of the subtractor 30e increases from 0 by a voltage −2LSB. The output of the comparator 8f changes from high level to low level, and the output B1 changes from high level to low level.

When the analog input signal AIN increases from the voltage FS/2 by a voltage −3LSB, the output of the subtractor 30e increases from 0 by a voltage −3LSB. The output of the comparator 7f changes from high level to low level, and the output W11 changes from high level to low level.

When the analog input signal AIN increase from the voltage FS/2 by a voltage −4LSB, the output of the subtractor 30e increases from 0 by a voltage −4LSB. The output of the comparator 6f changes from high level to low level, and the output B2 changes from high level to low level.

That is, in the vicinity of the upper end of the range in the embodiment of FIG. 7, the comparators (6f to 9f) perform A/D conversion every least significant bit LSB. The arithmetic operating unit 101 in the embodiment of FIG. 7 interpolates the lower three bits.

Therefore, in the embodiment of FIG. 7, correct codes 0 to 3 can be acquired, as shown in FIGS. 10J to 10L.

By the above-described operation, in the embodiment of FIG. 7, all the codes can be correctly acquired on the full scale FS.

Meanwhile, the waveform of the output OUT and the waveform of the output of the subtractor 30e have a region P4 where the outputs are undefined, respectively, near the transition point of the input SEL_A, as shown in FIGS. 8C and 8D. The region P4 is in the vicinity of the point where the analog input signal AIN becomes 0 and therefore in the vicinity of the switching point of the analog multiplexer 102.

In such vicinity of the region P4, the output W74 of the AND circuit 54a is at high level, and the output B2 of the AND circuit 51f, the output B1 of the AND circuit 52f and the output W11 of the AND circuit 53f are at low level and therefore masked.

That is, the auxiliary A/D converter 105 masks the outputs (B2, B1 and W11) in the vicinity of the switching point of the analog multiplexer 102.

The embodiment of FIG. 7 operates normally and no malfunction occurs in the embodiment of FIG. 7. The AND circuit 51f, the AND circuit 52f and the AND circuit 53f restrains malfunction based on the region P4 where the output is undefined.

While the input SEL_A of the analog multiplexer 102 is connected to the output of the comparator 10a in the above-described embodiment, similar effects and advantages can be achieved, for example, by connecting the input SEL_A to other signals than the output of the comparator 10a.

Specifically, in association with the embodiments of FIG. 2 and FIG. 7, similar effects and advantages can be achieved by connecting the input SEL_A of the analog multiplexer 102 to the signal that switches between the vicinity of the lower end of the range and the vicinity of the upper end of the range.

Moreover, while the output W74 is connected to the AND circuits (51f to 53f) in the above-described embodiment, similar effects and advantages can be achieved, for example, by connecting the output W73 to the AND circuits (51f to 53f).

Specifically, in association with the embodiment of FIG. 7, similar effects and advantages can be achieved as long as the auxiliary A/D converter 105 masks the output in the vicinity of the switching point (region P4) of the analog multiplexer 102.

Figure 11:
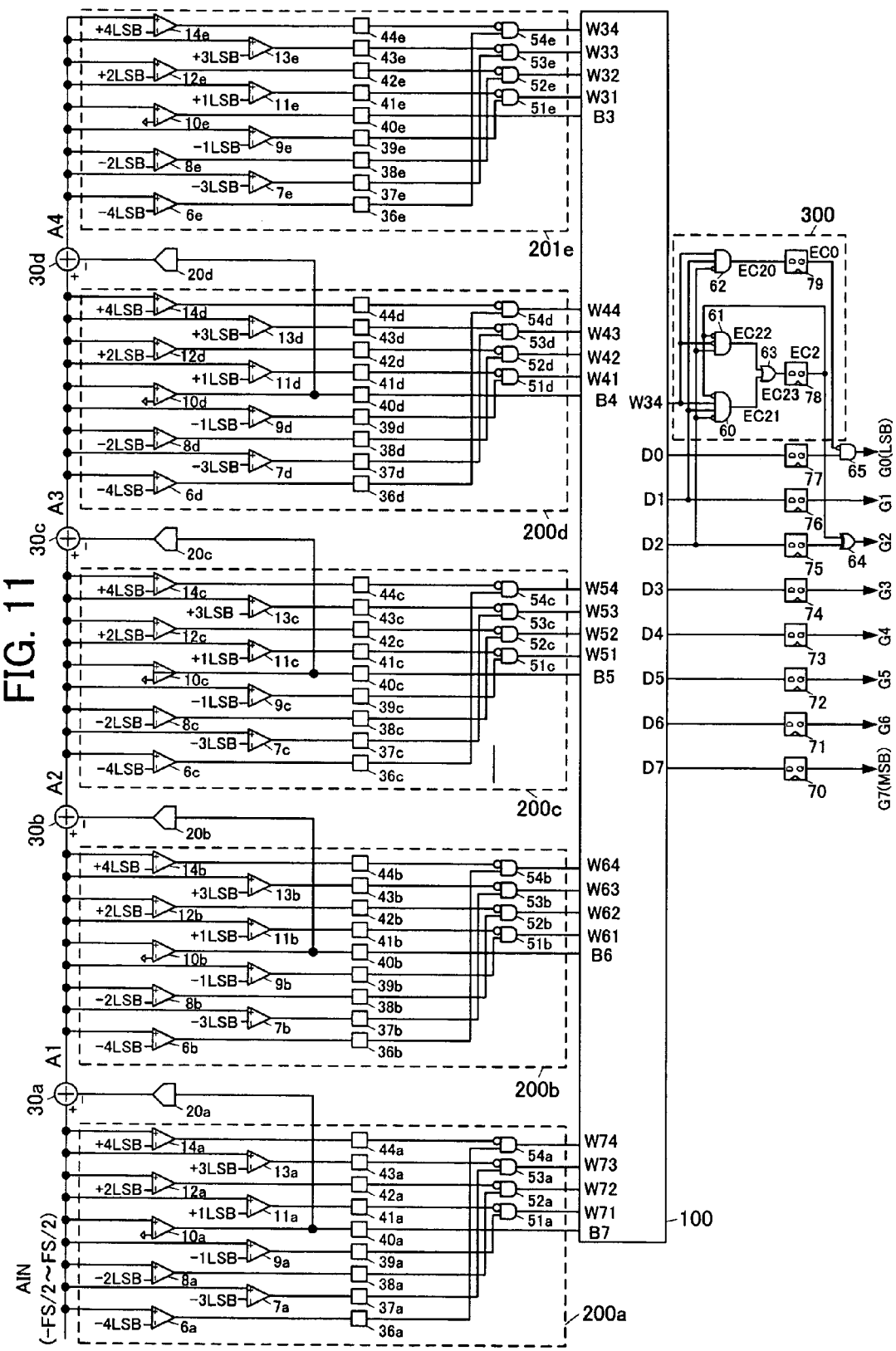
FIG. 11 is a structural view showing still another embodiment of this invention.

FIG. 11 is a structural view showing still another embodiment of this invention. The same elements as those in the embodiment of FIG. 2 are denoted by the same numerals and will not be described further in detail.

The embodiment of FIG. 11 is characterized by having a structure related to a differential non-linear error correcting circuit 300 (differential non-linear error correcting unit).

In the embodiment of FIG. 11, comparators (6a to 14a) latch circuits (36a to 44a) and AND circuits (51a to 54a) are formed with structures similar to those in the embodiment of FIG. 2, and they form a first sub-A/D converter 200a.

Similarly, comparators (6b to 14b), latch circuits (36b to 44b) and AND circuits (51b to 54b) form a second sub-A/D converter 200b. Comparators (6c to 14c), latch circuits (36c to 44c) and AND circuits (51c to 54c) form a third sub-A/D converter 200c. Comparators (6d to 14d), latch circuits (36d to 44d) and AND circuits (51d to 54d) form a fourth sub-A/D converter 200d.

A comparator 6e is a comparator for multiplication by −4 of the least significant bit LSB. Its non-inverting input is connected to an output A4 of a subtractor 30d, and its inverting input is connected to a voltage −4LSB. Its output is connected to an AND circuit 54e via a latch circuit 36e.

A comparator 14e is a comparator for multiplication by +4 of the least significant bit LSB. Its non-inverting input is connected to the output A4 of the subtractor 30d, and its inverting input is connected to a voltage +4LSB. Its output is connected to the AND circuit 54e via a latch circuit 44e and an inverting unit.

Comparators (6a to 14a), latch circuits (36e to 44e) and AND circuits (51e to 54e) form a fifth sub-A/D converter 201e.

Digital signals (D7 to D3) of upper five bits outputted from an arithmetic operating unit 100 become digital signals (G7 to G3) via flip-flops (70 to 74). The digital signal G7 is the most significant bit MSB.

A digital signal D2 of a lower bit becomes a digital signal G2 via a flip-flop 75 and an exclusive OR circuit 64. A digital signal D1 of a lower bit becomes a digital signal G1 via a flip-flop 76. Moreover, a digital signal D0 of a lower bit becomes a digital signal G0 via a flip-flop 77 and an AND circuit 65. The digital signal G0 is the least significant bit LSB.

The differential non-linear error correcting circuit 300 inputs the digital signal D2, the digital signal D1, and an output W34 of the AND circuit 54e, and outputs an output EC2 and an output EC0. The output EC2 is connected to an input of the exclusive OR circuit 64, and the output EC0 is connected to an input of the AND circuit 65 via an inverting unit.

The internal structure of the differential non-linear error correcting circuit 300 will now be described in detail.

To an input of an AND circuit 60, an inverted version of the digital signal D2, the digital signal D1, the output W34, and an inverted version of the output EC2 are connected.

To an input of an AND circuit 61, the digital signal D2, an inverted version of the output W34, and an inverted version of the output EC2 are connected.

To an input of an AND circuit 63, an output EC21 of the AND circuit 60 and an output EC22 of the AND circuit 61 are connected. An output EC23 of the AND circuit 63 becomes the output EC2 via a flip-flop 78.

Moreover, to an input of an AND circuit 62, an inverted version of the digital signal D2, the digital signal D1, and the output W34 are connected. An output EC20 of the AND circuit 62 becomes the output EC0 via a flip-flop 79.

That is, the AND circuits 60 to 62 calculate the logical products of the outputs of the comparators 6e and 14e, which are second comparators, and the digital signals D2 and D1 of lower bits.

Therefore, the outputs (EC21, EC22, EC23, EC20) in the differential non-linear error correcting circuit 300 satisfy the following logical expressions (25) to (28).

EC21=not (D2) and D1 and W34 and not (EC2)  (25)

EC22=D2 and not (W34) and not (EC2)  (26)

EC23=EC21 or EC22  (27)

EC20=not (D2) and D1 and W34  (28)

The digital signals (G7 to G0) satisfy the following logical expressions (29) to (36) and form 8-bit gray codes.

G7=D7  (29)

G6=D6  (30)

G5=D5  (31)

G4=D4 (32)

G3=D3 (33)

G2=D2 or EC2=D2 xor EC23 (34)

G1=D1 (35)

G0=D0 and not (EC0)=D0 and not (EC20) (36)

First, the operation in the case where the embodiment of FIG. 11 is in the normal state (ideal state), that is, in the case where the A/D conversion range of the sub-A/D converter 200a is stable, will be described.

In this case, the output EC21 is zero (EC21=0), the output EC22 is zero (EC22=0), the output EC23 is zero (EC23=0), and the output EC2 is zero (EC2=0). The output EC20 is zero (EC20=0) and the output EC0 is zero (EC0=0).

Thus, in the case, the digital signal G2 is the digital signal D2 (G2=D2) and the digital signal G0 is the digital signal D0 (G0=D0).

Therefore, the operation in the case where the embodiment of FIG. 11 is in the normal state is equivalent to the operation in the case where the embodiment of FIG. 2 is in the normal state. It is equivalent to the above-described operation in the embodiment of FIG. 2.

Next, the operation in the case where the embodiment of FIG. 11 is in an abnormal state (state deviated from the ideal state), that is, in the case where the A/D conversion range of the sub-A/D converter 200a varies, will be described.

Figure 12:
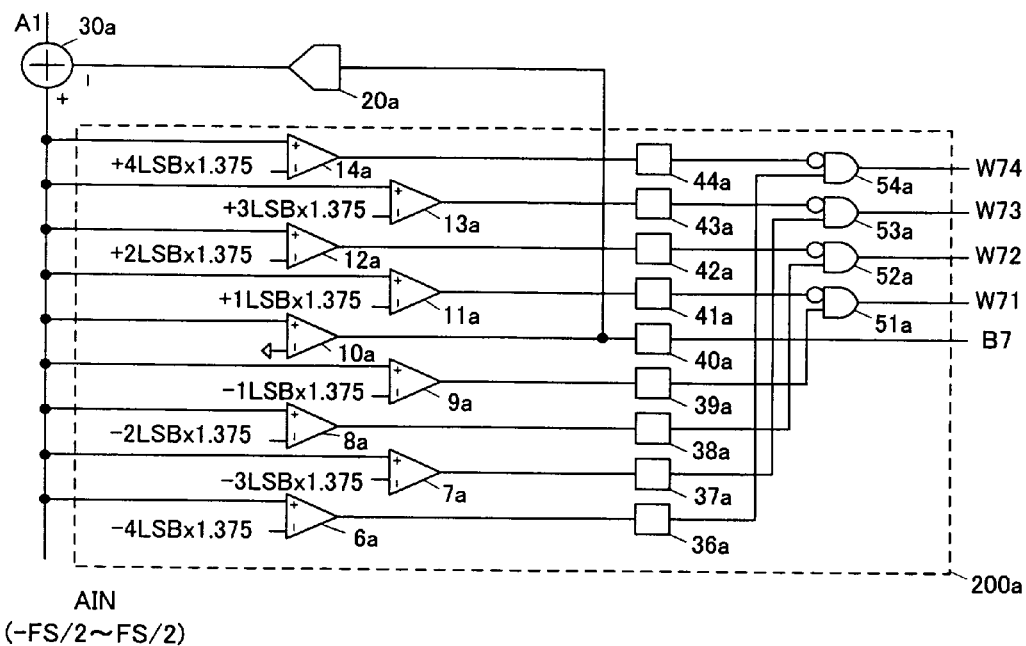
FIG. 12 is an equivalent circuit diagram of a sub-A/D converter 200a in the embodiment of FIG. 11 in the case where an input range is 1.375 times.
Figure 13:
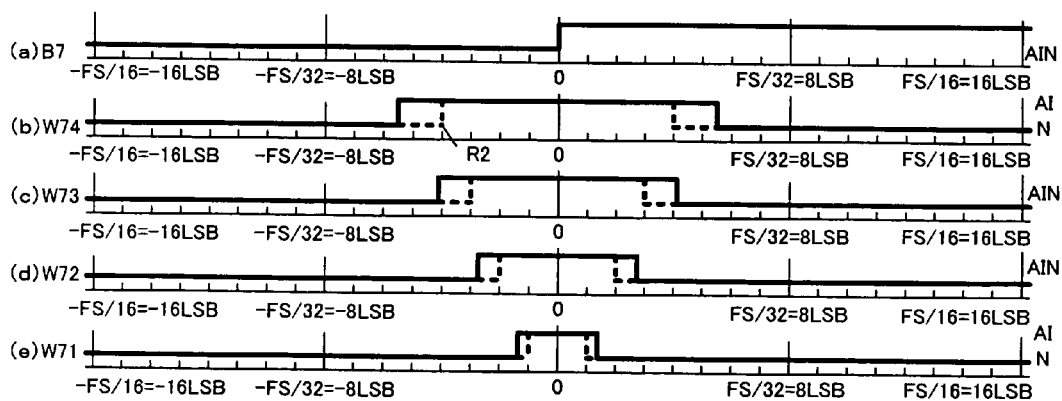
FIGS. 13A to 13E show operating waveforms in the embodiment of FIG. 12.
Figure 14:
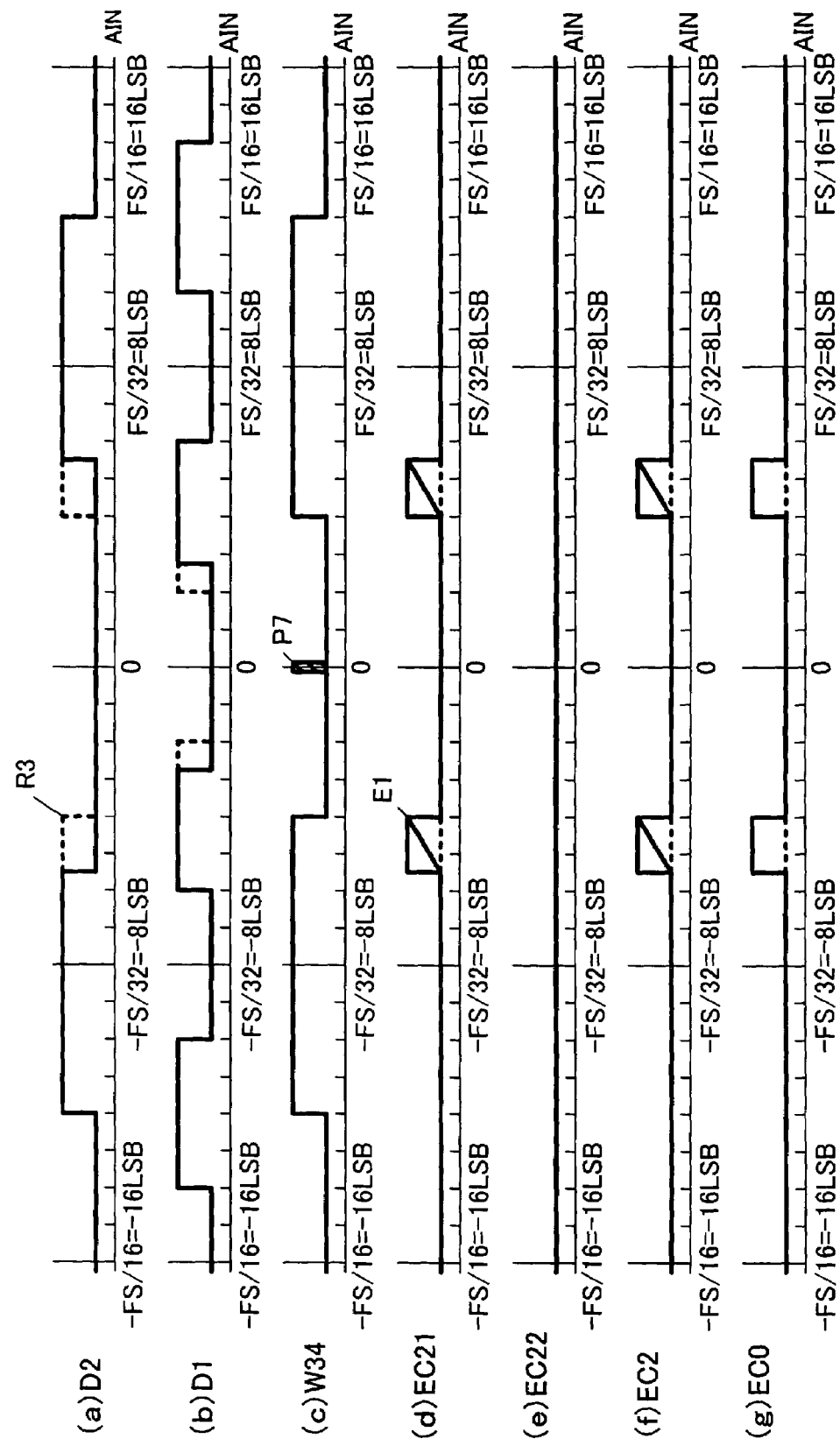
FIGS. 14A to 14G show operating waveforms in the case where an input range is 1.375 times in the embodiment of FIG. 11.
Figure 15:
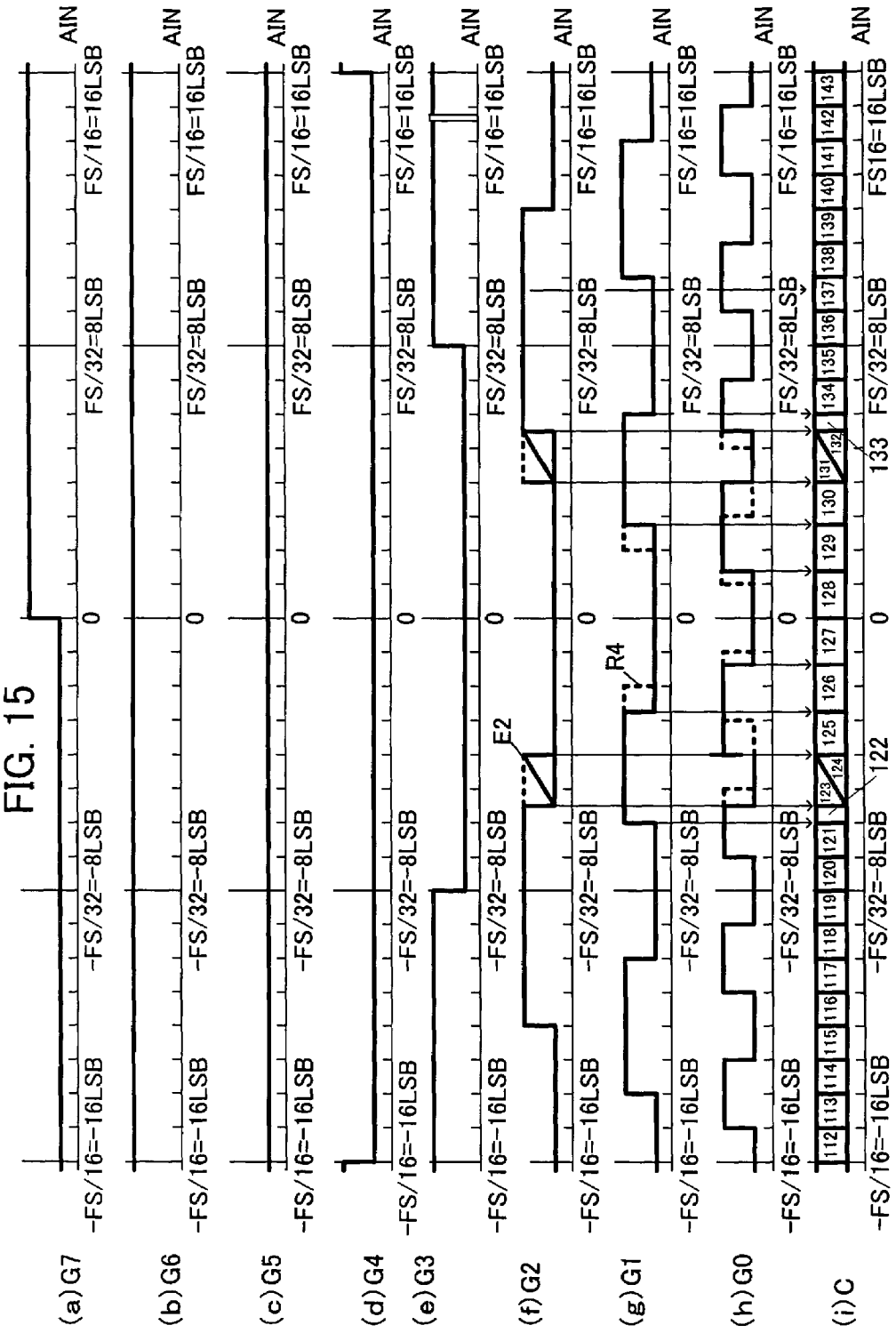
FIGS. 15A to 15I show operating waveforms in the case where an input range is 1.375 times in the embodiment of FIG. 11.

First, the operation in the embodiment of FIG. 11, for example, in the case where the input range of the sub-A/D converter 200a is 1.375 times, will be described. FIG. 12 is an equivalent circuit diagram of the sub-A/D converter 200a in the embodiment of FIG. 11 in the case where the input range is 1.375 times. The description of the other parts than the sub-A/D converter 200a is not given here.

In this case, the sub-A/D converter 200a in the embodiment of FIG. 11 is equivalently constructed as shown in the equivalent circuit diagram of FIG. 12. Specifically, the inverting input of the comparator 6a is a voltage (−4LSB×1.375) the inverting input of the comparator 7a is a voltage (−3LSB×1.375), the inverting input of the comparator 8a is a voltage (−2LSB×1.375), the inverting input of the comparator 9a is a voltage (−1LSB×1.375), the inverting input of the comparator 11a is a voltage (+1LSB×1.375), the inverting input of the comparator 12a is a voltage (+2LSB×1.375), the inverting input of the comparator 13a is a voltage (+3LSB×1.375), and the inverting input of the comparator 14a is a voltage (+4LSB×1.375).

FIGS. 13A to 15I show operating waveforms in the embodiment of FIG. 12 and operating waveforms in the case where the input range is 1.375 times in the embodiment of FIG. 11. In FIGS. 13A to 15I, the horizontal axes represent the analog input signal AIN within a range from −1/16 of the full scale FS (i.e., −FS/16) to +1/16 of the full scale FS (i.e., FS/16).

FIG. 13A shows the waveform of the output B7. FIG. 13B shows the waveform of the output W74. FIG. 13C shows the waveform of the output W73. FIG. 13D shows the waveform of the output W72. FIG. 13E shows the waveform of the output W71.

In FIGS. 13B to 13E, broken lines R2 represent characteristics in the case where the embodiment of FIG. 11 is in the ideal state (ideal characteristics). The characteristics of the outputs W74 to W71 change because the input range in the embodiment of FIG. 11 is enlarged.

FIG. 14A shows the waveform of the digital signal D2. FIG. 14B shows the waveform of the digital signal D1. FIG. 14C shows the waveform of the output W34. FIG. 14D shows the waveform of the output EC21. FIG. 14E shows the waveform of the output EC22. FIG. 14F shows the waveform of the output EC2. FIG. 14G shows the waveform of the output EC0.

In FIGS. 14A and 14B, broken lines R3 represent characteristics in the case where the embodiment of FIG. 11 is in the ideal state (ideal characteristics). In FIGS. 14D and 14F, slant line parts E1 represent characteristics that zero (0) and 1 occur alternately and evenly.

The regions where the broken lines R3 appear and the regions where the slant line parts E1 appear correspond to each other. That is, the AND circuit 60 and the AND circuit 62 detect a shift when the sub-A/D converter 200a enlarges the input range.

In the circuit formed by the AND circuit 60, the AND circuit 61, the AND circuit 63 and the flip-flop 78, zero (0) and 1 occur alternately and evenly. When the output EC2 becomes 1, the input of the AND circuit 60 becomes zero. Therefore, the output EC21 and the output EC2 have characteristics that zero (0) and 1 occur alternately and evenly.

FIG. 15A shows the waveform of the digital signal G7. FIG. 15B shows the waveform of the digital signal G6. FIG. 15C shows the waveform of the digital signal G5. FIG. 15D shows the waveform of the digital signal G4. FIG. 15E shows the waveform of the digital signal G3. FIG. 15F shows the waveform of the digital signal G2. FIG. 15G shows the waveform of the digital signal G1. FIG. 15H shows the waveform of the digital signal G0. FIG. 15I shows digital output codes C corresponding to the digital signals (G7 to G0).

In FIGS. 15G and 15H, broken lines R4 represent characteristics in the case where the embodiment of FIG. 11 is in the ideal state (ideal characteristics). Moreover, in FIG. 15F, slant line parts E2 represent characteristics that zero (0) and 1 occur alternately and evenly.

In FIG. 15I, all the digital output codes Care outputted. That is, no code is missing. The codes are arranged in order.

With the above-described structure, in the embodiment of FIG. 11, a shift in the case where the sub-A/D converter 200a enlarges the input range is detected and properly corrected.

Figure 16:
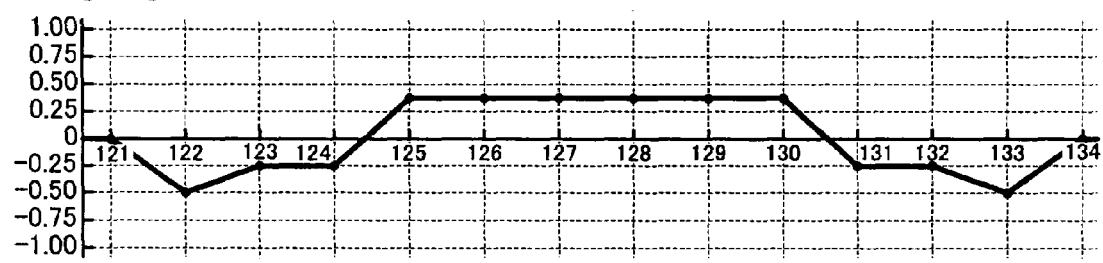
FIG. 16 shows differential non-linear error (DNL) based on the operating waveforms of FIGS. 15A to 15I in the case where an input range is 1.375 times in the embodiment of FIG. 11.

FIG. 16 shows differential non-linear error (DNL) based on the operating waveforms of FIGS. 15A to 15I in the case where the input range of the sub-A/D converter 200a is 1.375 times in the embodiment of FIG. 11. As shown in FIG. 16, the differential non-linear error is between −0.5LSB and +0.375LSB.

Therefore, in the embodiment of FIG. 11, the differential non-linear error can be reduced. Meanwhile, in the embodiment of FIG. 2, the differential non-linear error (DNL) in the case where the input range of the sub-A/D converter 200a is 1.375 times is between −1LSB and +0.875LSB (not shown).

Figure 17:
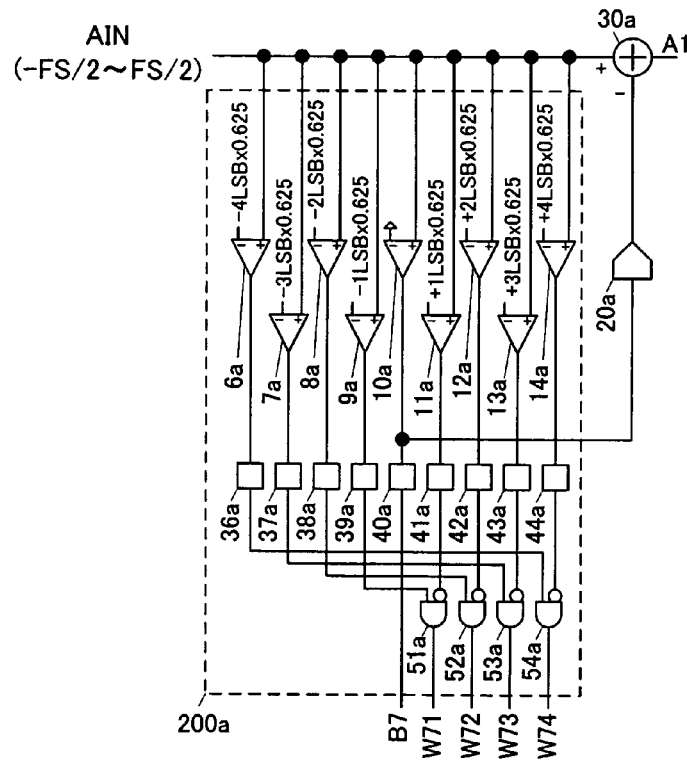
FIG. 17 is an equivalent circuit diagram of the sub-A/D converter 200a in the embodiment of FIG. 11 in the case where an input range is 0.625 times.
Figure 18:
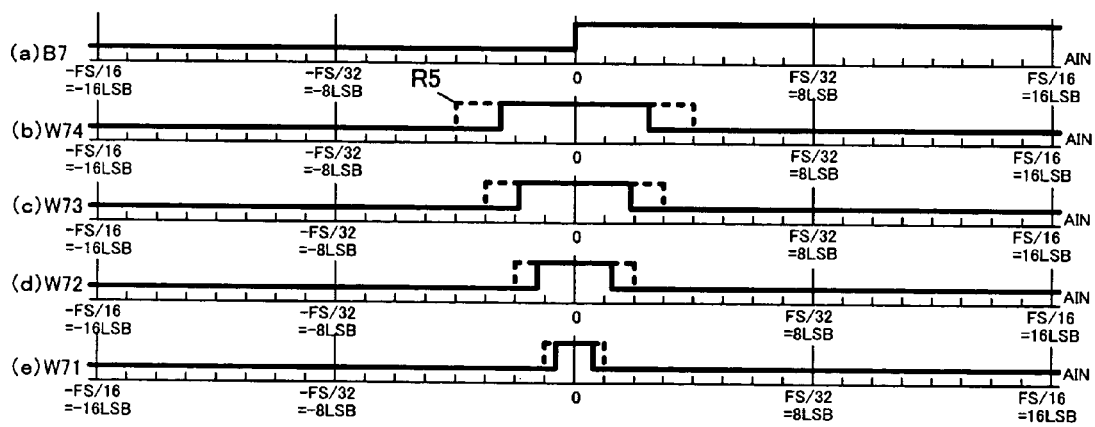
FIGS. 18A to 18E show operating waveforms in the embodiment of FIG. 17.
Figure 19:
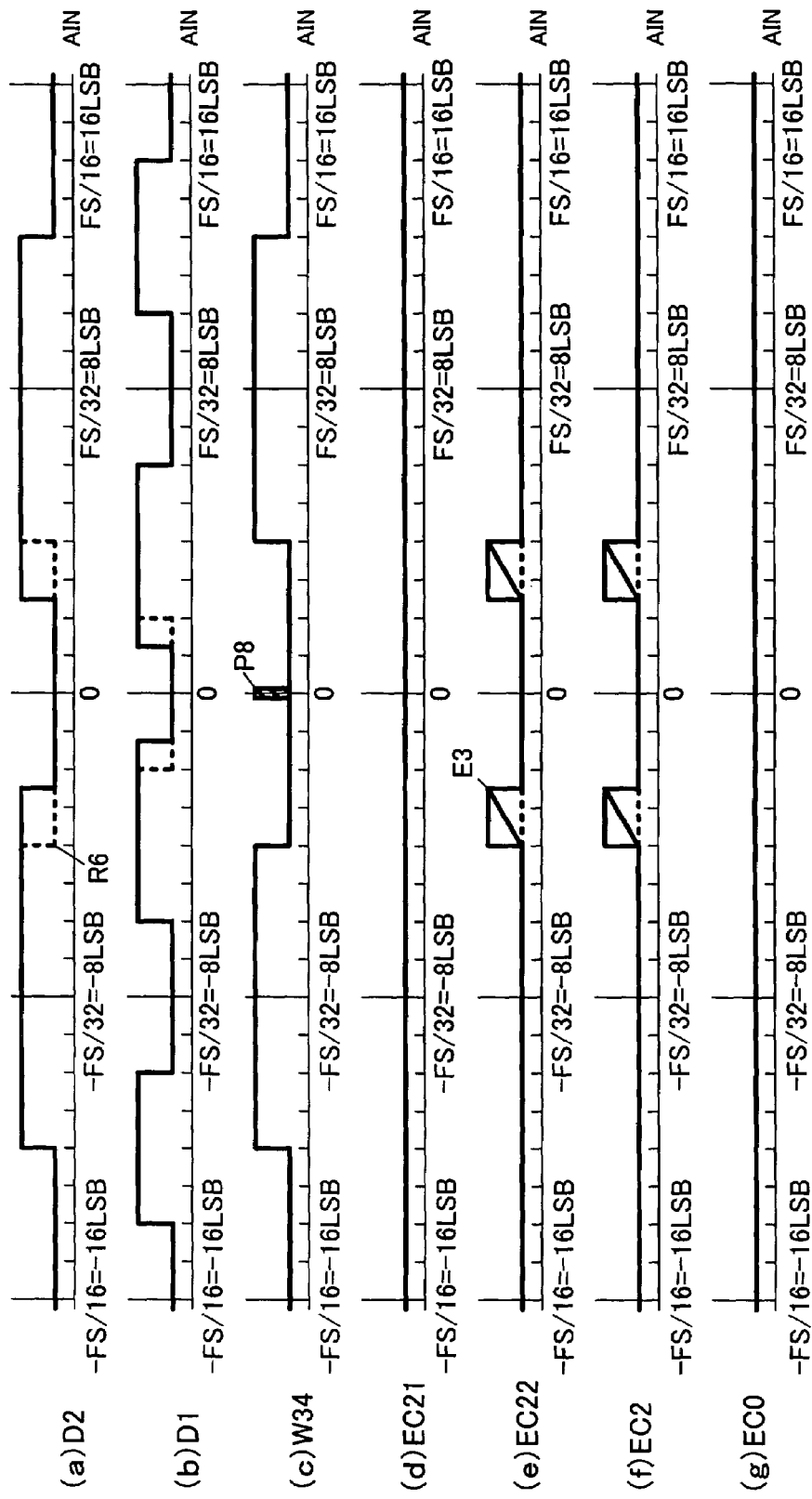
FIGS. 19A to 19G show operating waveforms in the case where an input range is 0.625 times in the embodiment of FIG. 11.

Second, the operation in the embodiment of FIG. 11 in the case where the input range of the sub-A/D converter 200a is 0.625 times will be described. FIG. 17 is an equivalent circuit diagram of the sub-A/D converter 200a in the embodiment of FIG. 11 in the case where the input range is 0.625 times. The equivalent circuit diagram of FIG. 17 corresponds to the equivalent circuit diagram of FIG. 12.

In this case, the sub-A/D converter 200a in the embodiment of FIG. 11 is equivalently structured as shown in the equivalent circuit diagram of FIG. 17. Specifically, the inverting input of the comparator 6a is a voltage (−4LSB×0.625) the inverting input of the comparator 7a is a voltage (−3LSB×0.625), the inverting input of the comparator 8a is a voltage (−2LSB×0.625), the inverting input of the comparator 9a is a voltage (−1LSB×1.375), the inverting input of the comparator 11a is a voltage (+1LSB×0.625), the inverting input of the comparator 12a is a voltage (+2LSB×0.625), the inverting input of the comparator 13a is a voltage (+3LSB×0.625), and the inverting input of the comparator 14a is a voltage (+4LSB×0.625).

FIGS. 18A to 20I show operating waveforms in the embodiment of FIG. 17 and operating waveforms in the case where the input range is 0.625 times in the embodiment of FIG. 11. FIGS. 18A to 20I correspond to FIGS. 13A to 15I. Therefore, similar parts will not be described further in detail.

In FIGS. 18B to 18E, broken lines R5 represent characteristics in the case where the embodiment of FIG. 11 is in the ideal state (ideal characteristics). The characteristics of the outputs W74 to W71 change because the input range in the embodiment of FIG. 11 is narrowed.

In FIGS. 19A and 19B, broken lines R6 represent characteristics in the case where the embodiment of FIG. 11 is in the ideal state (ideal characteristics). In FIGS. 19E and 19F, slant line parts E3 represent characteristics that zero (0) and 1 occur alternately and evenly.

The regions where the broken lines R6 appear and the regions where the slant line parts E3 appear correspond to each other. That is, the AND circuit 61 detects a shift when the sub-A/D converter 200a narrows the input range.

In the circuit formed by the AND circuit 60, the AND circuit 61, the AND circuit 63 and the flip-flop 78, zero (0) and 1 occur alternately and evenly. When the output EC2 becomes 1, the input of the AND circuit 61 becomes zero. Therefore, the output EC22 and the output EC2 have characteristics that zero (0) and 1 occur alternately and evenly.

In FIGS. 20G and 20H, broken lines R7 represent characteristics in the case where the embodiment of FIG. 11 is in the ideal state (ideal characteristics). Moreover, in FIG. 20F, slant line parts E4 represent characteristics that zero (0) and 1 occur alternately and evenly.

In FIG. 20I, all the digital output codes Care outputted. That is, no code is missing. The codes are arranged in order.

With the above-described structure, in the embodiment of FIG. 11, a shift in the case where the sub-A/D converter 200a narrows the input range is detected and properly corrected.

Figure 21:
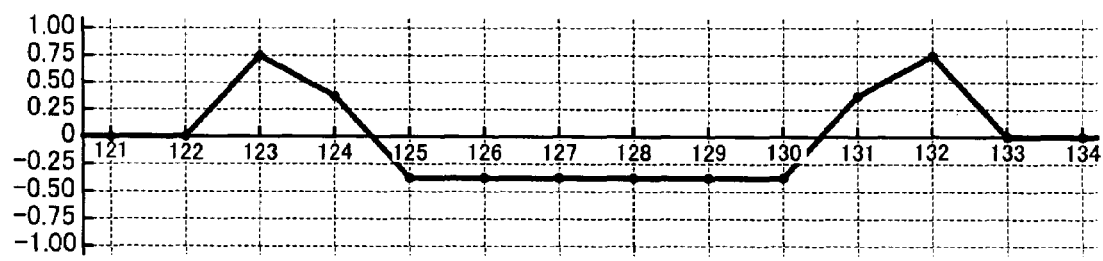
FIG. 21 shows differential non-linear error (DNL) based on the operating waveforms of FIGS. 20A to 20I in the case where an input range is 0.625 times in the embodiment of FIG. 11.

FIG. 21 shows differential non-linear error (DNL) based on the operating waveforms of FIGS. 20A to 20I in the case where the input range of the sub-A/D converter 200a is 0.625 times in the embodiment of FIG. 11. As shown in FIG. 21, the differential non-linear error is between −0.375LSB and +0.75LSB.

Therefore, in the embodiment of FIG. 11, the differential non-linear error can be reduced. Meanwhile, in the embodiment of FIG. 2, the differential non-linear error (DNL) in the case where the input range of the sub-A/D converter 200a is 0.625 times is between −0.375LSB and +1.5LSB (not shown).

In the above-described embodiment, the case where the input range of the sub-A/D converter 200a is deviated from the ideal state is described. However, similar effects and advantages can be achieved, for example, when the sub-A/D converter 200b to the sub-A/D converter 200d and the sub-A/D converter 200e are deviated from the ideal state.

While the 8-bit cascade A/D converter is used in the above-described embodiment, similarly preferable effects can be achieved by a cascade A/D converter other than the 8-bit cascade A/D converter.

As can be understood from the above description, this invention is not limited to the above-described embodiment and includes various changes and modifications without departing from the scope of the invention.

This invention has the following effects.

According to this invention, since fewer stages of fundamental constituent elements ADA may be used, the settling time is reduced and a high-speed cascade A/D converter can be provided.

Particularly, according to this invention, an 8-bit cascade A/D converter having fundamental constituent elements ADA cascaded in four stages can be formed.

Moreover, according to this invention, a high-speed cascade A/D converter that can correctly acquire all the codes on the full scale FS can be provided.

Also, according to this invention, a cascade A/D converter of lower cost and smaller size can be provided.

Moreover, according to this invention, it is possible to provide a cascade A/D converter that detects and properly corrects a shift when the input range of a sub-A/D converter varies.

What is claimed is:

1. A cascade A/D converter comprising fundamental constituent elements cascaded in plural stages, each fundamental constituent element comprising a first comparator for inputting an analog input signal, a D/A converter for converting an output of the first comparator to an analog signal again, and a subtractor for subtracting an output of the D/A converter from the analog input signal, the fundamental constituent elements comprising:
a second comparator for inputting the analog input signal every least significant bit near a transition point of the first comparator; and
an arithmetic operating unit for generating upper bits based on an output of the first comparator and interpolating lower bits based on an output of the second comparator.

2. The cascade A/D converter as claimed in claim 1, wherein a comparative voltage of the first comparator is 0.

3. The cascade A/D converter as claimed in claim 2, wherein a comparative voltage of the second comparator increases and decreases from 0 as a central value every least significant bit.

4. The cascade A/D converter as claimed in claim 1, comprising an auxiliary A/D converter formed in parallel with the fundamental constituent elements and for converting the analog input signal to a digital signal every least significant bit in the vicinity of a lower end of a range and in the vicinity of an upper end of the range.

5. The cascade A/D converter as claimed in claim 4, wherein the auxiliary A/D converter has an analog multiplexer for switching the vicinity of the lower end of the range and the vicinity of the upper end of the range.

6. The cascade A/D converter as claimed in claim 5, wherein the auxiliary A/D converter masks an output near a switching point of the analog multiplexer.

7. The cascade A/D converter as claimed in claim 1, wherein the fundamental constituent elements are cascaded in four stages, and
the second comparator has a comparator for multiplication by −4 of the least significant bit, a comparator for multiplication by −3 of the least significant bit, a comparator for multiplication by −2 of the least significant bit, a comparator for multiplication by −1 of the least significant bit, a comparator for multiplication by +1 of the least significant bit, a comparator for multiplication by +2 of the least significant bit, a comparator for multiplication by +3 of the least significant bit, and a comparator for multiplication by +4 of the least significant bit.

8. The cascade A/D converter as claimed in claim 7, comprising an auxiliary A/D converter formed in parallel with the fundamental constituent elements, the auxiliary A/D converter having a comparator for multiplication by one of the least significant bit, a comparator for multiplication by two of the least significant bit, a comparator for multiplication by three of the least significant bit, and a comparator for multiplication by four of the least significant bit, the auxiliary A/D converter converting the analog input signal to a digital signal in the vicinity of a lower end of a range and in the vicinity of an upper end of the range.

9. The cascade A/D converter as claimed in claim 7, wherein outputs (W74, W64, W54, W44) based on an output of the comparator for multiplication by −4 of the least significant bit and an output of the comparator for multiplication by +4 of the least significant bit, outputs (W73, W63, W53, W43, W33) based on an output of the comparator for multiplication by −3 of the least significant bit and an output of the comparator for multiplication by +3 of the least significant bit, outputs (W72, W62, W52, W42, W32) based on an output of the comparator for multiplication by −2 of the least significant bit and an output of the comparator for multiplication by +2 of the least significant bit, outputs (W71, W61, W51, W41, W31) based on an output of the comparator for multiplication by −1 of the least significant bit and an output of the comparator for multiplication by +1 of the least significant bit, and the lower bits (D2, D1, D0) are correlated with the following logical expressions:

D2=not (W74 or W64 or W54 or W44)

D1=not (W72 or W62 or W52 or W42 or W32)

D0=(W73 or W63 or W53 or W43 or W33) and not (W71 or W61 or W51 or W41 or W31).

10. The cascade A/D converter as claimed in claim 1, comprising a differential non-linear error correcting unit for detecting a shift of a A/D conversion range of a sub-A/D converter having the second comparator and correcting the shift.

11. The cascade A/D converter as claimed in claim 10, wherein the differential non-linear error correcting unit has an AND circuit for detecting the shift on the basis of a logical product an output of a comparator formed on a stage subsequent to the fundamental constituent elements and the lower bits.

12. The cascade A/D converter as claimed in claim 11, wherein the differential non-linear error correcting unit has a unit for generating zero and 1 alternately and evenly with respect to the shift and thus correcting the shift.

13. The cascade A/D converter as claimed in claim 9, comprising:

AND circuits (60, 61, 62) for inputting an output (W34) based on an output of the comparator (6e) for multiplication by −4 of the least significant bit and an output of the comparator (14e) for multiplication by +4 of the least significant bit, and the lower bits (D2, D1), the AND circuit being formed on a stage subsequent to the fundamental constituent elements;

an exclusive OR circuit (64) of outputs of the AND circuits and the lower bit (D2); and an AND circuit (65) of the outputs of the AND circuits and the lower bit (D0).

* * * * *